United States Patent [19]

Hayashi

[11] Patent Number: 5,780,909
[45] Date of Patent: Jul. 14, 1998

[54] SEMICONDUCTOR MEMORY DEVICE WITH A TWO-LAYER TOP GATE

[75] Inventor: Fumihiko Hayashi, Tokyo, Japan

[73] Assignee: NEC Corporation, Tokyo, Japan

[21] Appl. No.: 905,334

[22] Filed: Aug. 4, 1997

Related U.S. Application Data

[63] Continuation of Ser. No. 607,811, Feb. 27, 1996, abandoned.

[30] Foreign Application Priority Data

Feb. 28, 1995 [JP] Japan ................... 7-040167

[51] Int. Cl.[6] ........................... H01L 29/786
[52] U.S. Cl. .................. 257/393; 257/388; 257/903; 257/904
[58] Field of Search ................ 257/903, 901, 257/393, 388

[56] References Cited

U.S. PATENT DOCUMENTS

| | | | |
|---|---|---|---|
| 5,266,587 | 11/1993 | Wu | 257/903 |
| 5,281,843 | 1/1994 | Ochii et al. | 257/904 |
| 5,382,807 | 1/1995 | Tsutsumi et al. | 257/903 |
| 5,391,894 | 2/1995 | Itabashi et al. | 257/903 |
| 5,483,083 | 1/1996 | Meguro et al. | 257/903 |
| 5,491,654 | 2/1996 | Azuma | 257/393 |
| 5,497,022 | 3/1996 | Sakamoto | 257/903 |
| 5,535,155 | 7/1996 | Abe | 257/393 |

FOREIGN PATENT DOCUMENTS

5-251666 9/1993 Japan.

OTHER PUBLICATIONS

"16Mbit SRAM Cell Technologies for 2.0V Operation," H. Ohkubo et al., IEDM Technical Digest, 1991, pp. 481–484.
"Improvement of Soft Error Immunity in a Polysilicon PMOS Load Memory Cell," Kiyotsugu Ueda et al., Article C–427, Electronic Communication Association Autumn Meeting, 1991.

Primary Examiner—David B. Hardy
Attorney, Agent, or Firm—Young & Thompson

[57] ABSTRACT

The present invention provides a semiconductor memory device including (a) a substrate, (b) a first MOS transistor acting as a driver, the first MOS transistor being formed on the substrate, (c) a second MOS transistor acting as a load, the second MOS transistor being formed on an insulative layer formed on the substrate, and (d) a gate electrode formed on a gate insulating film above a channel region of the second MOS transistor, the gate electrode comprising a semiconductor layer and a layer composed of metallic compound thereof. The present invention avoids significant reduction of breakdown voltage of a gate electrode in SRAM including a p-channel TFT as a load, even if a gate insulating film of a p-channel TFT is made thin.

16 Claims, 12 Drawing Sheets

5,780,909

1

SEMICONDUCTOR MEMORY DEVICE WITH A TWO-LAYER TOP GATE

This application is a continuation of application Ser. No. 08/607,811, filed Feb. 27, 1996, now abandoned.

BACKGROUND OF THE INVENTION

1. Field of the Invention

The invention relates to a semiconductor memory device and a method of fabricating the same, and more particularly to a static random access memory (SRAM) having a p-channel thin film transistor (TFT) as a MOS transistor acting as a load, and a method of fabricating the same.

2. Description of the Related Art

In order to obtain higher integration in a memory cell of a static random access memory (SRAM), it is advantageous to use a high resistance element as a load element. However, if even higher integration and lower consumption of power is required, it is more advantageous to use a p-channel thin film transistor (hereinafter, referred to simply as TFT) as a load element in order also to obtain stability against soft errors caused by leakage current, noise or alpha rays.

With reference to FIG. 1 which is a circuit diagram of a memory cell of SRAM, hereinbelow is explained the structure of the memory cell of SRAM including p-channel MOS transistors acting as a load.

The illustrated memory cell includes six MOS transistors; two n-channel MOS transistors $T_{T1}$ and $T_{T2}$ acting as a transferor, two n-channel MOS transistors $T_{D1}$ and $T_{D2}$ acting as a driver, and two p-channel MOS transistors $T_{L1}$ and $T_{L2}$ acting as a load. These six MOS transistors are electrically connected with each other as follows.

A first inverter consisting of $T_{D1}$ and $T_{L1}$ and a second inverter consisting of $T_{D2}$ and $T_{L2}$ are connected in an intersecting way at two junction points $N_1$ and $N_2$. N-type source regions of $T_{D1}$ and $T_{D2}$ and p-type source regions of $T_{L1}$ and $T_{L2}$ are connected to a grounding conductor to which a voltage Vss is being applied, and a power source line to which a voltage Vcc is being applied, respectively. Gate electrodes of $T_{T1}$ and $T_{T2}$ are commonly connected to a word line WL. N-type source regions of $T_{T1}$ and $T_{T2}$ are connected to bit lines BL-1 and BL-2, respectively, and n-type drain regions of $T_{T1}$ and $T_{T2}$ are connected to $N_1$ and $N_2$, respectively.

On the assumption that high level potential is applied to $N_1$ and low level potential is applied to $N_2$, $T_{L1}$ and $T_{L2}$ are caused to be in on-state and off-state, respectively. Herein, if a potential at $N_1$ is reduced due to soft error caused by leakage current, noise or alpha rays, $T_{L1}$ is caused to enter on-state in further degree, resulting in that $T_{L1}$ effectively supplies charges to $N_1$ to thereby recover the potential of $N_1$. Since $T_{L1}$ and $T_{L2}$ have a higher ability than a high resistance element with respect to supplying charges to $N_1$ and $N_2$, data stored in a memory cell is unlikely to invert due to soft errors to be caused due to leakage current, noise or alpha rays, thereby stability of a memory cell is enhanced.

The four n-channel MOS transistors $T_{T1}$, $T_{T2}$, $T_{D1}$ and $T_{D2}$ are formed on a p-type silicon substrate, whereas the two p-channel MOS transistors $T_{L1}$ and $T_{L2}$ are formed as TFT to thereby obtain higher integration. The inventor has reported an example of a memory cell of SRAM having a p-channel TFT as a load element in IEDM Technical Digest, pp. 481–484, 1991.

Hereinbelow will be explained the reported memory cell of SRAM with reference to FIGS. 2A to 2C: FIGS. 2A and

2

2B are plan views of the memory cell, and FIG. 2C is a cross-sectional view taken along the lines Z—Z in FIGS. 2A and 2B.

As illustrated in FIG. 2C, on a p-type silicon substrate 301 are formed field oxide 302 in device isolation regions by selective oxidation process and gate oxide 303 in device formation regions by thermal oxidation process. On the silicon substrate 301 are also formed two n-channel MOS transistors $T_{T1}$ and $T_{T2}$ acting as a transferor and two n-channel MOS transistors $T_{D1}$ and $T_{D2}$ acting as a driver. The silicon substrate 301 is covered with a gate oxide 303 between the field oxide 302. The gate oxide 303 is formed with contact holes 304a and 304b. There are formed gate electrodes 305aa, 305ab, 305ba and 305bb on the silicon substrate 301 through the gate oxide 303. These gate electrodes 305aa, 305ab, 305ba and 305bb have a polycided structure comprising an n-type polysilicon film and a tungsten-silicide film deposited on the n-type polysilicon film. There are also formed n-type diffusion layers 306aa, 306ab, 306ac, 306ba, 306bb and 306bc in the device formation regions on the p-type silicon substrate 301 in self-alignment with the field oxide 302 and the gate electrodes 305aa, 305ab, 305ba and 305bb.

The gate electrodes 305ab and 305bb acting also as a word line (WL) are electrically connected with each other outside the memory cell. The gate electrodes 305aa and 305ba are electrically connected with the n-type diffusion layers 306bb and 306ab through the contact holes 304b and 304a, respectively. The first transferor n-channel MOS transistor $T_{T1}$ is composed of the gate electrode 305ab, gate oxide 303, n-type diffusion layer 306ac (n-type source region), and n-type diffusion layer 306ab (n-type drain region), the second transferor n-channel MOS transistor $T_{T2}$ is composed of the gate electrode 305bb, gate oxide 303, n-type diffusion layer 306bc (n-type source region), and n-type diffusion layer 306bb (n-type drain region), the first driver n-channel MOS transistor $T_{D1}$ is composed of the gate electrode 305aa, gate oxide 303, n-type diffusion layer 306aa (n-type source region), and n-type diffusion layer 306ab (n-type drain region) which is shared together with the transistor $T_{T1}$, and the second driver n-channel MOS transistor $T_{D2}$ is composed of the gate electrode 305ba, gate oxide 303, n-type diffusion layer 306ba (n-type source region), and n-type diffusion layer 306bb (n-type drain region) which is shared together with the transistor $T_{T2}$.

These four n-channel MOS transistors are covered with an interlayer insulating film 307. The interlayer insulating film 307 is formed with ground contact holes 308a and 308b reaching the n-type diffusion layers 306aa and 306ab, respectively. The n-type diffusion layers 306aa and 306ab are electrically connected through the ground contact holes 308a and 308b with a grounding conductor 309 deposited on the interlayer insulating film 307. The grounding conductor 309 is made of a tungsten-silicide film, and is formed with an opening at a certain area which will be mentioned later.

The interlayer insulating film 307 and the grounding conductor 309 are covered with a second interlayer insulating film 313. On the second interlayer insulating film 313 are formed two bottom-gate type p-channel TFTs $T_{L1}$ and $T_{L2}$ each acting as a load.

Contact holes 314a and 314b passes through the second and first interlayer insulative layers 313 and 307 and reach the gate electrodes 305ba and 305aa, respectively. The contact holes 314a and 314b are located substantially above the contact holes 304a and 304b, respectively. Gate electrodes 321b and 321a formed on the second interlayer insulating film 313 and composed of a polysilicon film are electrically connected with the gate electrodes 305ba and 305aa through the contact holes 314a and 314b. The second interlayer insulating film 313 together with the gate electrodes 321a and 321b is covered with a gate insulating film 323. The gate insulating film 323 is located substantially above the contact holes 314a and 314b, and is formed with contact holes 324a and 324b reaching the gate electrodes 321b and 321a, respectively.

On the gate insulating film 323 are formed two polysilicon film patterns. A first polysilicon film pattern is constituted of a p-type diffusion region 346aa (p-type drain region) electrically connected with the gate electrode 321b through the contact hole 324a, a channel region 331a a composed of n-type polysilicon film and lying generally across the gate electrode 321a through the gate insulating film 323, and a p-type diffusion region 346ab (p-type source region) constituting a part of a power source line, whereas a second polysilicon film pattern is constituted of a p-type diffusion region 346ab (p-type drain region) electrically connected with the gate electrode 321a through the contact hole 324b, a channel region 331ba composed of n-type polysilicon film and lying generally across the gate electrode 321b through the gate insulating film 323, and a p-type diffusion region 346bb (p-type source region) constituting a part of the power source line. The p-type diffusion regions 346ab and 346bb are electrically connected with each other outside the memory cell.

A first p-channel TFT $T_{L1}$ acting as a load is composed of the p-type diffusion region 346aa, channel region 331a a and p-type diffusion region 346ab all of which constitutes the first polysilicon film pattern, and further of the gate insulating film 323 and the gate electrode 321a, whereas a second p-channel TFT $T_{L2}$ acting as a load is composed of the p-type diffusion region 346ab, channel region 331ba and p-type diffusion region 346bb all of which constitutes the second polysilicon film pattern, and further of the gate insulating film 323 and the gate electrode 321b.

The second interlayer insulating film 313 and the first and second p-channel TFTs are covered with a third interlayer insulating film 353. Bit contact holes 354a and 354b pass through the third interlayer insulating film 353, gate insulating film 323, second interlayer insulating film 313, first interlayer insulating film 307 and gate oxide 303, and reaches the n-type diffusion layers 306ac and 306bc, respectively. A pair of bit lines 359a (BL-1) and 359b (BL-2) are formed on the third interlayer insulating film 353, and electrically connected with the n-type diffusion layers 306ac and 306bc through the bit contact holes 354a and 354b, respectively. The above mentioned opening to be formed in a certain area of the grounding conductor 309 is an area in which the contact holes 314a and 314b and the bit contact holes 354a and 354b are to be formed.

With further reference to FIGS. 3A to 3E which are cross-sectional views taken along the lines Z—Z of FIGS. 2A and 2B, SRAM having been suggested in the above mentioned report is manufactured in accordance with 0.4 µm design rule as follows.

On the p-type silicon substrate 301 are formed the field oxide 302 in device isolation regions by selective oxidation, and the gate oxide 303 in device formation regions by thermal oxidation. The contact holes 304a and 304b are formed at a certain location in the gate oxide 303 by wet etching using buffered hydrofluoric acid. The reason why the wet etching is allowed to be used for forming the contact holes 304a and 304b are that there is no difficulties, even if a diameter of the contact holes is made slightly too large due to over etching.

Then, an n-type polysilicon film and a tungsten-silicide film are successively deposited, and these deposited films are patterned to thereby form the gate electrodes 305aa, 305ab, 305ba and 305bb. The gate electrodes 305aa and 305ba are electrically connected with a surface of the p-type silicon substrate 301 through the contact holes 304b and 304a. An overlap margin over which a distal end of the gate electrode 305aa is overlapped with the gate oxide 303 in the contact hole 304b is about 0.1 µm. Then, there are formed the n-type diffusion layers 306aa, 306ab, 306ac, 306ab, 306bb and 306bc on the p-type silicon substrate 301, for instance, by arsenic (As) ion-implanting using the field oxide 302 and the gate electrodes 305aa, 305ab, 305ba and 305bb as a mask. The n-type diffusion layers 306aa, 306ab, 306ac, 306ab, 306bb and 306bc have impurity concentration ranging from $10^{20}$ to $10^{21}$ cm$^{-3}$. For instance, the n-type diffusion layer 306ab has a junction depth ranging from 0.2 to 0.3 µm just below the contact hole 304a, whereas ranging from 0.15 to 0.2 µm just below the gate oxide 303.

Then, the first interlayer insulating film 307 is deposited all over a resultant by LPCVD. Then, the ground contact holes 308a and 308b reaching the n-type diffusion layers 306aa and 306ab, respectively, are formed in the first interlayer insulating film 307. Subsequently, a tungsten-silicide film is deposited over a resultant. The tungsten-silicide film is formed at a certain area with an opening to thereby form the grounding conductor 309 which is electrically connected with the n-type diffusion layers 306aa and 306ab through the ground contact holes 308a and 308b, as illustrated in FIGS. 2A, 2C and 3A. The thus formed grounding conductor 309 is composed of the tungsten-silicide film. The above mentioned certain area is an area including segments A and B, the contact holes 314a, 314b, 354a and 354b to be formed at subsequent step being to pass through the segment A, and segment B being a marginal area located around the segment A and having a length ranging from 0.1 to 0.2 µm.

Then, the second interlayer insulating film 313 having a flat surface is deposited over a resultant by LPCVD. Then, the contact holes 314b and 314a are formed so that they pass through the second and first interlayer insulating films 313 and 307 and reach portions of the gate electrodes 305aa and 305ba located just above the contact holes 304b and 304a, respectively. Then, a polysilicon film is deposited over a resultant by LPCVD, and n-type or p-type impurities are doped into the resultant by ion implantation at the concentration of $10^{16}$ to $10^{19}$ cm$^{-3}$. Then, the polysilicon film is patterned to thereby form the gate electrodes 321a and 321b. These gate electrodes 321a and 321b are electrically connected with the gate electrodes 305aa and 305ba through the contact holes 314b and 314a. Then, the gate insulating film 323 composed of a silicon dioxide film (HTO film) is deposited over a resultant by LPCVD, as illustrated in FIGS. 2A to 2C and 3B.

Then, a photoresist 329 is formed so that it has openings generally in alignment with the contact holes 314b and 314a. Then, the gate insulating film 323 is anisotropically dry-etched by using the photoresist 329 as a mask to thereby form the contact holes 324b and 324a in the gate electrodes 321a and 321b, respectively, as illustrated in FIGS. 2A to 2C and 3C. It is preferable to carry out the anisotropic dry etching so that a resultant becomes slightly over etched. The reason of this is to avoid the gate insulating film 323 from not being removed or remaining as a sidewall spacer at a surface of the gate electrode 321b which covers a sidewall of the contact hole 314a.

It should be noted that isotropic etching is not to be used for the formation of the contact holes 324a and 324b. If isotropic etching is to be used for the formation of the contact holes 324a and 324b, the contact holes would partially protrude out of the gate electrodes 321a and 321b due to over etching, which brings some difficulties in a polysilicon film etching to be carried out in a subsequent step. The gate electrodes 321a and 321b are preferably made of a polysilicon film. If the gate electrodes 321a and 321b are to be composed of a silicide film, polycide film or refractory metal film, the gate insulating film 323 comes to partial contact with the gate electrodes 321a and 321b, resulting in reduction of reliability.

Then, the photoresist 329 is removed by ashing. Then, a resultant is washed with acid. Then, the gate insulating film 323 is washed with weak hydrofluoric acid in order to remove portions of the gate insulating film 323 which have not been removed and hence remain at a surface of the gate electrode 321b covering a sidewall of the contact hole 314a, and also remove a natural oxide film formed due to the previous acid washing. Subsequently, an amorphous silicon film is deposited over a resultant by LPCVD. The amorphous silicon film is annealed at about 60° C. and thus changed into a polysilicon film. Then, n-type impurities are ion-implanted into the polysilicon film, and thus the polysilicon film becomes an n-type one including impurities at the concentration ranging from $10^{16}$ to $10^{18}$ cm$^{-3}$. The thus formed n-type polysilicon film is patterned to thereby form the polysilicon film patterns 331a and 331b. These polysilicon film patterns 331a and 331b are electrically connected with the gate electrode 321b and 321a through the contact holes 324a and 324b, respectively, as illustrated in FIGS. 2A to 2C and 3D.

It is not possible to have a large overlap margin of the polysilicon film pattern 331a over the contact hole 324a, for instance. The overlap margin is 0.2 μm at greatest. Hence, as having been mentioned earlier, isotropic etching in which buffered hydrofluoric acid is to be used is not allowed to use for the formation of the contact holes 324a and 324b.

Then, there is formed a photoresist 339 covering at least both a portion of the polysilicon film pattern 331a covering the gate electrode 321a and a portion of the polysilicon film pattern 331b covering the gate electrode 321b. Then, boron ion-implanting is carried out by using the photoresist as a mask. Thus, ion-implanted portions of the polysilicon film pattern 331a make the p-type diffusion regions 346aa and 346ab, whereas a non- ion-implanted portion of the pattern 331a forms the channel region 331a a. Similarly, ion-implanted portions of the polysilicon film pattern 331b make the p-type diffusion regions 346ab and 346bb, whereas a non-ion-implanted portion of the pattern 331b forms the channel region 331ba, as illustrated in FIGS. 2A to 2C and 3E. The p-type diffusion regions 346aa, 346ab, 346ab and 346bb have the impurity concentration ranging from $10^{18}$ to $10^{20}$ cm$^{-3}$. In particular, if the p-type diffusion regions 346aa and 346ab acting as a drain region has the impurity concentration at an order of $10^{21}$ cm$^{-3}$, a leakage current would increase in a p-channel TFT including those p-type diffusion regions 346aa and 3346ab. The p-type diffusion regions 346aa and 346ab are disposed in off-set relation with the gate electrodes 321a and 321b, respectively, and are electrically connected with the gate electrodes 321b and 321a through the contact holes 324a and 324b, respectively. The p-type diffusion regions 346ab and 346bb are disposed in no off-set relation with the gate electrodes 321a and 321b, and constitute a part of a power source line. The p-type diffusion regions 346ab and 346bb are electrically connected with each other outside the memory cell.

After the photoresist 339 has been removed, there is formed the third interlayer insulating film 353 having a flat surface over a resultant, and then, there are formed the bit contact holes 354a and 354b reaching the n-type diffusion layers 306ac and 306bc. Then, a pair of the bit lines 359a and 359b are formed in electrical connection with the n-type diffusion layers 306ac and 306bc through the bit contact holes 354a and 354b, respectively, as illustrated in FIGS. 2A to 2C.

FIG. 4 is a graph showing the dependency of ON-state current on a gate oxide thickness in a unit gate width in a p-channel TFT having a gate insulating film composed of a silicon dioxide film. As is obvious in view of the graph in FIG. 4, ON-state current would be increased for a thinner thickness of a gate insulating film also in a p-channel TFT. Accordingly, it is necessary for the gate insulating film 323 in the above mentioned report to be made thin in order to obtain a high-speed SRAM having high current driving ability.

In a method of fabricating a memory cell of SRAM including TFT having been suggested in the above mentioned report, it is necessary to carry out anisotropic dry etching, in particular, slightly over etching, for the formation of the contact holes 324a and 324b in the gate insulating film 323 because it is preferable for the gate electrodes 321b and 321a to be composed of a polysilicon film, also because it is necessary to form the contact holes 324a and 324b so that they do not protrude out of the gate electrodes 321b and 321a, and further because it is necessary to avoid the gate insulating film 323 from being not removed and hence remaining as a sidewall spacer at a surface of the gate electrode 321b covering a sidewall of the contact hole 314a, for instance. Accordingly, it is necessary to remove the photoresist 329 by oxygen-plasma enhanced ashing, and then wash a resultant with acid. As a result, it is also necessary to carry out surface treatment of the gate insulating film 323 with weak hydrofluoric acid. This surface treatment causes the gate insulating film 323 to be locally thin. As a thickness of the gate insulating film 323 is decreased, the breakdown voltage of a gate is significantly lowered accordingly.

This problem is caused partially by a method of fabrication, but mainly by a structure of a semiconductor memory device. That is, unless TFT having a bottom-gate structure is to be used, it is inevitably necessary to form the contact holes in both the gate electrodes composed of a polysilicon film and the gate insulating film.

Japanese Unexamined Patent Publication No. 5-251666 has disclosed a cell structure in which gate electrodes of TFT are formed so that they sandwich a channel region. The cell structure disclosed in the Publication is to be applied to MOSFET acting as a load and composed of double-gate TFT. The Publication also discloses a method of avoiding the degradation of breakdown voltage of the gate electrode Gpl and the silicon layer 108 of the channel region, which degradation would be caused by the gate insulating film 107 being made thin in the step of removing a natural oxide film formed in the contact hole 112 as illustrated in FIG. 11 of the Publication. Thus, as illustrated in FIG. 12, after the insulative layer 107 covering the bottom-gate electrode Gpl has been protected with the first silicon layer 118, the natural oxide film of the contact hole is to be removed. In addition, on the first silicon layer 118 is deposited a second silicon layer 128 which is to be electrically connected with the p-type impurity diffusion layer 116 through the contact hole, thereby the second silicon layer 128 being electrically connected with a power source Vcc.

As illustrated in FIG. 2 of the Publication, there is formed an insulating film 11 between a firstly layered polysilicon 10 and a secondly layered polysilicon 13 in order to reduce leakage current in TFT having a two-layer structured channel region. As a result, it is possible to avoid the insulating film 9, which directly covers the gate electrode Gp1 formed below the firstly layered polysilicon 10, from being damaged, because there is to be formed the polysilicon 10 on the insulating film 9, and it is also possible to avoid the reduction of a drain current and the generation of a leakage current, because there is to be formed the insulating film 11 between the polysilicons 10 and 13.

However, the Publication admits itself that it is not possible to prevent the insulating film 11 covering the firstly layered polysilicon 10 from being damaged. In this method, there is formed the contact hole 12 in the step shown in FIG. 2d, and then a surface of the semiconductor substrate 1 exposed through the contact hole 12 is washed with hydrofluoric acid. Thus, even if it is possible to prevent the insulating film 9 from being damaged, it is not possible to avoid the insulating film 11 covering the firstly layered polysilicon 10 from being damaged. Thus, it is impossible by the method disclosed in the Publication No. 5-251666 to protect the insulating film 11 having been deposited on the channel region or the polysilicon 10.

SUMMARY OF THE INVENTION

It is an object of the present invention to provide a semiconductor memory device having such a structure that the breakdown voltage of a gate electrode is not lowered so significantly, even if a thickness of a gate insulating film of a p-channel TFT is made thin.

Another object of the present invention is to provide a method of fabricating such a semiconductor memory device.

In one aspect, the present invention provides a semiconductor memory device including (a) a substrate, (b) a first MOS transistor acting as a driver, the first MOS transistor being formed on the substrate, (c) a second MOS transistor acting as a load, the second MOS transistor being formed on an insulative layer formed on the substrate, and (d) a gate electrode formed on a gate insulating film above a channel region of the second MOS transistor, the gate electrode including a semiconductor layer and a layer composed of metallic compound thereof.

In a preferred embodiment, a source/drain region of the second MOS transistor is electrically connected with a gate electrode of the first MOS transistor through the metallic compound layer. The semiconductor layer includes a polysilicon layer, and the layer composed of metallic compound thereof includes a silicided polysilicon layer.

The present invention further provides a semiconductor memory device including (a) a substrate, (b) a first MOS transistor acting as a driver, the first MOS transistor being formed on the substrate, (c) a second MOS transistor acting as a load, the second MOS transistor being formed on an insulative layer formed on the substrate, and (d) an upper gate electrode formed on a channel region of the second MOS transistor with a gate insulating film being sandwiched therebetween, the upper gate electrode including a semiconductor layer and a layer composed of metallic compound thereof, and (e) a lower gate electrode formed under the channel region of the second MOS transistor with a gate insulating film being sandwiched therebetween, the lower gate electrode including a semiconductor layer.

A source/drain region of the second MOS transistor is preferably electrically connected with a gate electrode of the first MOS transistor through the metallic compound layer. The semiconductor layer of the upper and lower gate electrodes includes a polysilicon layer, and the layer composed of metallic compound thereof includes a silicided polysilicon layer.

The present invention still further provides a semiconductor memory device including (a) a first MOS transistor acting as a transferor and formed on a first conductivity type silicon substrate, the first transferor MOS transistor having a first gate electrode including a first source region electrically connected with one of a pair of bit lines, a first drain region, a gate insulating film, and a first gate electrode electrically connected with a word line, the first transferor MOS transistor having a second conductivity type channel, the first source and drain regions having the same conductivity type as that of the channel, (b) a second MOS transistor acting as a transferor and formed on the first conductivity type silicon substrate, the second transferor MOS transistor having a second gate electrode including a second source region electrically connected with the other of the pair of bit lines, a second drain region, a gate insulating film, and a second gate electrode electrically connected with the word line, the second transferor MOS transistor having a second conductivity type channel, the second source and drain regions having the same conductivity type as that of the channel, (c) a first MOS transistor acting as a driver formed on the first conductivity type silicon substrate, the first driver MOS transistor having a third gate electrode including a third source region electrically connected with a grounding conductor, a third drain region electrically connected with the first drain region, a gate insulating film, and a third gate electrode, the first driver MOS transistor having a second conductivity type channel, the third source and drain regions having the same conductivity type as that of the channel, (d) a second MOS transistor acting as a driver and formed on the first conductivity type silicon substrate, the second driver MOS transistor having a fourth gate electrode including a fourth source region electrically connected with the grounding conductor, a fourth drain region electrically connected with both the second drain region and the third gate electrode, a gate insulating film, and a fourth gate electrode electrically connected with the third drain region, the second driver MOS transistor having a second conductivity type channel, the fourth source and drain regions having the same conductivity type as that of the channel, (e) an interlayer insulating film covering surfaces of the first and second transferor MOS transistors and the first and second driver MOS transistors therewith, (f) a first polysilicon film pattern composed of a first polysilicon film deposited on the interlayer insulating film, the first polysilicon film pattern including a first first-conductivity-type drain region having a portion A extending above the fourth gate electrode, a first channel region, and a first first-conductivity-type source region electrically connected with a power source line, (g) a second polysilicon film pattern composed of the first polysilicon film, the second polysilicon film pattern including a second first-conductivity-type drain region having a portion B extending above the third gate electrode, a second channel region, and a second first-conductivity-type source region electrically connected with the power source line, (h) a gate insulating film deposited over the interlayer insulating film for covering surfaces of the first and second polysilicon film patterns, (i) a third polysilicon film pattern composed of a second polysilicon film deposited on the gate insulating film, the third polysilicon film pattern having a portion extending above the portion B, the third polysilicon film pattern covering the first channel region with the gate insulating film sandwiched therebetween, (j) a fourth polysilicon film pattern composed of the second polysilicon film, the fourth polysilicon film pattern having a portion extending above the portion A, the third polysilicon film pattern covering the second channel region with the gate insulating film sandwiched therebetween, (k) a first sidewall defining a first node contact hole reaching the third gate electrode through the third polysilicon film pattern, gate insulating film, second first-conductivity-type drain region and interlayer insulating film, (l) a second sidewall defining a second node contact hole reaching the fourth gate electrode through the fourth polysilicon film pattern, gate insulating film, first first-conductivity-type drain region and interlayer insulating film, (m) a fifth gate electrode selectively and directly covering an upper surface of the third polysilicon film pattern, the fifth gate electrode including a first conductive film pattern electrically connected with the third gate electrode and the second first-conductivity-type drain region through the first node contact hole, (n) a sixth gate electrode selectively and directly covering an upper surface of the fourth polysilicon film pattern, the sixth gate electrode including a second conductive film pattern electrically connected with the fourth gate electrode and the first first-conductivity-type drain region through the second node contact hole, (o) a first thin film transistor acting as a load and having a first-conductivity-type channel, the first thin film transistor including the first first-conductivity-type source region, first channel region, first first-conductivity-type drain region, gate insulating film and fifth gate electrode, and (p) a second thin film transistor acting as a load and having a first-conductivity-type channel, the second thin film transistor including the second first-conductivity-type source region, second channel region, second first-conductivity-type drain region, gate insulating film and sixth gate electrode The present invention yet provides a semiconductor memory device including (a) a first MOS transistor acting as a transferor and formed on a first conductivity type silicon substrate, the first transferor MOS transistor having a first gate electrode including a first source region electrically connected with one of a pair of bit lines, a first drain region, a gate insulating film, and a first gate electrode electrically connected with a word line, the first transferor MOS transistor having a second conductivity type channel, the first source and drain regions having the same conductivity type as that of the channel, (b) a second MOS transistor acting as a transferor formed on the first conductivity type silicon substrate, the second transferor MOS transistor having a second gate electrode including a second source region electrically connected with the other of the pair of bit lines, a second drain region, a gate insulating film, and a second gate electrode electrically connected with the word line, the second transferor MOS transistor having a second conductivity type channel, the second source and drain regions having the same conductivity type as that of the channel, (c) a first MOS transistor acting as a driver formed on the first conductivity type silicon substrate, the first driver MOS transistor having a third gate electrode including a third source region electrically connected with a grounding conductor, a third drain region electrically connected with the first drain region, a gate insulating film, and a third gate electrode, the first driver MOS transistor having a second conductivity type channel, the third source and drain regions having the same conductivity type as that of the channel, (d) a second MOS transistor acting as a driver formed on the first conductivity type silicon substrate, the second driver MOS transistor having a fourth gate electrode including a fourth source region electrically connected with the grounding conductor, a fourth drain region electrically connected with both the second drain region and the third gate electrode, a gate insulating film, and a fourth gate electrode electrically connected with the third drain region, the second driver MOS transistor having a second conductivity type channel, the fourth source and drain regions having the same conductivity type as that of the channel, (e) an interlayer insulating film covering surfaces of the first and second transferor MOS transistors and the first and second driver MOS transistors therewith, (f) a fifth gate electrode formed on the interlayer insulating film, the fifth gate electrode having a portion A extending above the third gate electrode, (g) a sixth gate electrode formed on the interlayer insulating film, the sixth gate electrode having a portion B extending above the fourth gate electrode, (h) a first gate insulating film deposited over the interlayer insulating film for covering surfaces of the fifth and sixth gate electrodes, (i) a first polysilicon film pattern composed of a first polysilicon film deposited on the first gate insulating film, the first polysilicon film pattern including a first first-conductivity-type drain region having a portion C extending above the sixth gate electrode, a first channel region located above the fifth gate electrode, and a first first-conductivity-type source region electrically connected with a power source line, (j) a second polysilicon film pattern composed of the first polysilicon film, the second polysilicon film pattern including a second first-conductivity-type drain region having a portion D extending above the fifth gate electrode, a second channel region located above the sixth gate electrode, and a second first-conductivity-type source region electrically connected with the power source line, (k) a second gate insulating film deposited over the first gate insulating film for covering surfaces of the first and second polysilicon film patterns, (l) a third polysilicon film pattern composed of a second polysilicon film deposited on the second gate insulating film and located above the fifth gate electrode, (m) a fourth polysilicon film pattern composed of the second polysilicon film and located above the sixth gate electrode, (n) a first sidewall defining a first node contact hole reaching the third gate electrode through the third polysilicon film pattern, second gate insulating film, second first-conductivity-type drain region, first gate insulating film, fifth gate electrode and interlayer insulating film, (o) a second sidewall defining a second node contact hole reaching the fourth gate electrode through the fourth polysilicon film pattern, second gate insulating film, first first-conductivity-type drain region, first gate insulating film, sixth gate electrode and interlayer insulating film, (p) a seventh gate electrode selectively and directly covering an upper surface of the third polysilicon film pattern, the seventh gate electrode including a first conductive film pattern electrically connected with the third gate electrode and the second first-conductivity-type drain region through the first node contact hole, and the third polysilicon film pattern, (q) an eighth gate electrode selectively and directly covering an upper surface of the fourth polysilicon film pattern, the eighth gate electrode including a second conductive film pattern electrically connected with the fourth gate electrode and the first first-conductivity-type drain region through the second node contact hole, and the fourth polysilicon film pattern, (r) a first thin film transistor acting as a load and having a first-conductivity-type channel, the first thin film transistor including the fifth gate electrode, first gate insulating film, first first-conductivity-type source region, first channel region, first first-conductivity-type drain region, second gate insulating film and seventh gate electrode, and (s) a second thin film transistor acting as a load and having a first-conductivity-type channel, the second thin film transistor including the sixth gate electrode, first gate insulating film, second first-conductivity-type source region, second channel region, second first-conductivity-type drain region, second gate insulating film and eighth gate electrode.

For instance, the first conductivity type is p-type and the second conductivity type is n-type. The first and second conductive film patterns are preferably composed of refractory metal, refractory metal silicide, titanium nitride or titanium-tungsten.

In another aspect, the present invention provides a method of fabricating a semiconductor memory device including the steps of (a) forming a field oxide and a gate oxide in a device isolation area and a device formation area, respectively, on a first conductivity type silicon substrate, (b) forming on the silicon substrate (A) a first second-conductivity-type MOS transistor acting as a transferor and including a first second-conductivity-type source region, a first second-conductivity-type drain region, and a first gate electrode acting as both a gate oxide and a word line, (B) a second second-conductivity-type MOS transistor acting as a transferor and including a second second-conductivity-type source region, a second second-conductivity-type drain region, and a second gate electrode acting as both the gate oxide and the word line, (C) a first second-conductivity-type MOS transistor acting as a driver and including a third second-conductivity-type source region, a third second-conductivity-type drain region electrically connected with the first second-conductivity-type drain region, the gate oxide, and a third gate electrode, (D) a second second-conductivity-type MOS transistor acting as a driver and including a fourth second-conductivity-type source region, a fourth second-conductivity-type drain region electrically connected with both the second second-conductivity-type drain region and the third gate electrode, and a fourth gate electrode electrically connected with both the gate oxide and the third second-conductivity-type drain region, (c) depositing a first interlayer insulating film over a resultant, (d) forming first and second ground contact holes with the first interlayer insulating film, the first and second ground contact holes reaching the third and fourth second-conductivity-type source regions, respectively, (e) forming a grounding conductor having an opening and electrically connected with the third and fourth second-conductivity-type source regions through the first and second ground contact holes, (f) depositing a second interlayer insulating film over a resultant, (g) forming a first second-conductivity-type polysilicon film over a resultant, (h) patterning the first polysilicon film to thereby form both a first polysilicon film pattern including a portion A extending above the fourth gate electrode, and a second polysilicon film pattern including a portion B extending above the third gate electrode, (i) depositing a gate insulating film over a resultant, (j) forming a second polysilicon film over a resultant, (k) successively etching the portions A and B, gate insulating film, second and first polysilicon film patterns, second interlayer insulating film, and first interlayer insulating film to thereby define first and second node contact holes reaching the third and fourth gate electrodes, (l) depositing a conductive film over a resultant, (m) patterning the conductive film and the second polysilicon film to thereby form fifth and sixth gate electrodes, the fifth gate electrode including a third polysilicon film pattern reaching the first node contact hole across a certain area of the first polysilicon film pattern through the gate insulating film, and a first conductive film pattern selectively and directly covering an upper surface of the third polysilicon film pattern and electrically connected with the third gate electrode and the second polysilicon film pattern through the first node contact hole, the sixth gate electrode including a fourth polysilicon film pattern reaching the second node contact hole across a certain area of the second polysilicon film pattern through the gate insulating film, and a second conductive film pattern selectively and directly covering an upper surface of the fourth polysilicon film pattern and electrically connected with the fourth gate electrode and the first polysilicon film pattern through the second node contact hole, (n) diffusing first-conductivity-type impurities in the first and second polysilicon film patterns by using the fifth and sixth gate electrodes as a mask to form in the first polysilicon film pattern a first first-conductivity-type source region constituting a part of a power source line, a first channel region, and a first first-conductivity-type drain region electrically connected with the sixth gate electrode through the second node contact hole and also form in the second polysilicon film pattern a second first-conductivity-type source region constituting a part of the power source line, a second channel region, and a second first-conductivity-type drain region electrically connected with the fifth gate electrode through the first node contact hole, to thereby form a first first-conductivity-type thin film transistor acting as a load and including the first first-conductivity-type source region, first channel region, first first-conductivity-type drain region, gate insulating film and fifth gate electrode and also form a second first-conductivity-type thin film transistor acting as a load and including the second first-conductivity-type source region, second channel region, second first-conductivity-type drain region, gate insulating film and sixth gate electrode, (o) depositing a third interlayer insulating film over a resultant, and (p) successively etching the third, second and first interlayer insulating films to form first and second bit contact holes reaching the first and second second-conductivity-type source regions, respectively, to thereby form a pair of bit lines each of which is electrically connected with the first and second second-conductivity-type source regions through the first and second bit contact holes, respectively.

The present invention further provides a method of fabricating a semiconductor memory device including the steps of (a) forming a field oxide and a gate oxide in a device isolation area and a device formation area, respectively, on a first conductivity type silicon substrate, (b) forming on the silicon substrate (A) a first second-conductivity-type MOS transistor acting as a transferor and including a first second-conductivity-type source region, a first second-conductivity-type drain region, and a first gate electrode acting as both a gate oxide and a word line, (B) a second second-conductivity-type MOS transistor acting as a transferor and including a second second-conductivity-type source region, a second second-conductivity-type drain region, and a second gate electrode acting as both the gate oxide and the word line, (C) a first second-conductivity-type MOS transistor acting as a driver and including a third second-conductivity-type source region, a third second-conductivity-type drain region electrically connected with the first second-conductivity-type drain region, the gate oxide, and a third gate electrode, (D) a second second-conductivity-type MOS transistor acting as a driver and including a fourth second-conductivity-type source region, a fourth second-conductivity-type drain region electrically connected with both the second second-conductivity-type drain region and the third gate electrode, and a fourth gate electrode electrically connected with both the gate oxide and the third second-conductivity-type drain region, (c) depositing a first interlayer insulating film over a resultant, (d) forming first and second ground contact holes with the first interlayer insulating film, the first and second ground contact holes reaching the third and fourth second-conductivity-type source regions, respectively, (e) forming a grounding conductor having an opening and electrically connected with the third and fourth second-conductivity-type source regions through the first and second ground contact holes, (f) depositing a second interlayer insulating film over a resultant, (g) forming both a fifth gate electrode including a portion A extending above the third gate electrode, and a sixth gate electrode including a portion B extending above the fourth gate electrode, (h) depositing a first gate insulating film over a resultant, (i) forming a first second-conductivity-type polysilicon film over a resultant, (j) patterning the first polysilicon film to thereby form a first polysilicon film pattern having a portion C extending above the portion B across the fifth gate electrode, and a second polysilicon film pattern having a portion D extending over the portion A across the sixth gate electrode, (k) depositing a second gate insulating film over a resultant, (1) forming a second polysilicon film over a resultant, (m) successively etching the portions A and B, second gate insulating film, second and first polysilicon film patterns, first gate insulating film, fifth and sixth gate electrodes, second interlayer insulating film, and first interlayer insulating film to thereby define first and second node contact holes reaching the third and fourth gate electrodes, (n) depositing a conductive film over a resultant, (o) patterning the conductive film and the second polysilicon film to thereby form seventh and eighth gate electrodes, the seventh gate electrode including a third polysilicon film pattern covering the fifth gate electrode through the second and first gate insulating films and reaching the first node contact hole, and a first conductive film pattern selectively and directly covering an upper surface of the third polysilicon film pattern and electrically connected with the third gate electrode and the second polysilicon film pattern through the first node contact hole, the eighth gate electrode including a fourth polysilicon film pattern covering the sixth gate electrode through the second and first gate insulating films and reaching the second node contact hole, and a second conductive film pattern selectively and directly covering an upper surface of the fourth polysilicon film pattern and electrically connected with the fourth gate electrode and the first polysilicon film pattern through the second node contact hole, (p) diffusing first-conductivity-type impurities in the first and second polysilicon film patterns by using the seventh and eighth gate electrodes as a mask to form in the first polysilicon film pattern a first first-conductivity-type source region constituting a part of a power source line, a first channel region, and a first first-conductivity-type drain region electrically connected with both the sixth and eighth gate electrodes through the second node contact hole and also form in the second polysilicon film pattern a second first-conductivity-type source region constituting a part of the power source line, a second channel region, and a second first-conductivity-type drain region electrically connected with the fifth and seventh gate electrodes through the first node contact hole, to thereby form a first first-conductivity-type thin film transistor acting as a load and including the fifth gate electrode, first gate insulating film, first first-conductivity-type source region, first channel region, first first-conductivity-type drain region, second gate insulating film and seventh gate electrode, and also form a second first-conductivity-type thin film transistor acting as a load and including the sixth gate electrode, first gate insulating film, second first-conductivity-type source region, second channel region, second first-conductivity-type drain region, second gate insulating film and eighth gate electrode, (q) depositing a third interlayer insulating film over a resultant, and (r) successively etching the third, second and first interlayer insulating films to form first and second bit contact holes reaching the first and second second-conductivity-type source regions, respectively, to thereby form a pair of bit lines each of which is electrically connected with the first and second second-conductivity-type source regions through the first and second bit contact holes, respectively.

The advantages obtained by the aforementioned present invention will be described hereinbelow.

As having been described, a semiconductor memory device made in accordance with the present invention has a load element comprising a top-gate or double-gate p-channel TFT formed on a surface of an interlayer insulating film. In a p-channel TFT to which the present invention is applied, source, channel and drain regions are formed in a first polysilicon film, and an upper gate electrode is composed of a second polysilicon film and a conductive film deposited on the second polysilicon film. Thus, it is possible to use the conductive film as a part of cross connection of a pair of CMOS inverters. The connection between a gate electrode of an n-channel MOS transistor constituting a CMOS inverter and a gate electrode of the p-channel TFT is accomplished by the above mentioned conductive film, which extends from the gate electrode of the -p-channel TFT, through a node contact hole which extends from the second polysilicon film to pass through a gate insulating film of the p-channel TFT, the first polysilicon film and interlayer insulating films, and reaches the gate electrode of the n-channel MOS transistor.

The above mentioned structure of the semiconductor memory device made in accordance with the present invention ensures that the etching of the gate insulating film of the p-channel TFT to be carried out for the formation of the node contact hole is carried out with the gate insulating film being covered with the second polysilicon film. Thus, the gate insulating film is not damaged in the etching to be carried out for the formation of the node contact hole, and in addition, it is possible to avoid that washing with acid and treatment with weak hydrofluoric acid both to be carried out as post-treatment of the etching make the gate insulating film locally thin in thickness. Thus, the present invention makes it possible to avoid the significant reduction of the breakdown voltage of a gate electrode of a p-channel TFT.

The above mentioned Japanese Unexamined Patent Publication No. 5-251666 attempts to solve a problem which would occur when a natural oxide film formed on the contact hole 12 is to be removed with hydrofluoric acid in a case that the polysilicon layers 10 and 13 are electrically connected with the Vcc power source line 22 in a dual gate type TFT acting as a load MOSFET. In brief, the Publication resolves the problem by forming the opening 15 as illustrated in FIG. 2f thereof. On the other hand, the present invention resolves a problem which would occur when there is to be formed a contact for connecting a gate electrode of a load TFT with a gate electrode of a driver transistor. More specifically, the present invention avoids an insulating film from being damaged when a contact is formed or after a contact has been formed on the premise that polysilicon films which will make channel and source/drain regions have been already formed and that an insulative or silicon dioxide film which will make a gate insulating film of TFT has also been already formed on the polysilicon films. This is just what the above mentioned Publication cannot resolve, because the Publication admits that it is not possible to avoid the insulating film 11 disposed on the polysilicon 10 from being damaged when the contact hole 12 is treated with hydrofluoric acid. In the present invention, on an insulating film formed on a channel region is formed a gate electrode having a two layer structure comprising a polysilicon layer and a silicided polysilicon layer, and a source/ drain region of a load MOS transistor is electrically connected with a gate electrode of a driver MOS transistor through the silicided polysilicon film. Thus, the present invention can overcome a problem which cannot be resolved by the above mentioned Publication.

In addition to the above mentioned advantage, the present invention makes it easy to fabricate an RC delay circuit for enhancing soft error immunity. The gate electrode may comprise two polysilicon layers, and the resistance of the lower polysilicon film can be raised by decreasing the impurity concentration. Specifically, the resistance R as illustrated in FIG. 5D, which will be described later in detail, is increased. On the other hand, the upper polysilicon layer remains to have a low resistance, since it is silicided. Thus, a gate electrode of a driver transistor can be connected to a source/ drain region of TFT with a low resistance therebetween.

The above and other objects and advantageous features of the present invention will be made apparent from the following description made with reference to the accompanying drawings, in which like reference characters designate the same or similar parts throughout the drawings.

16

DESCRIPTION OF THE PREFERRED EMBODIMENTS

Figure 1:
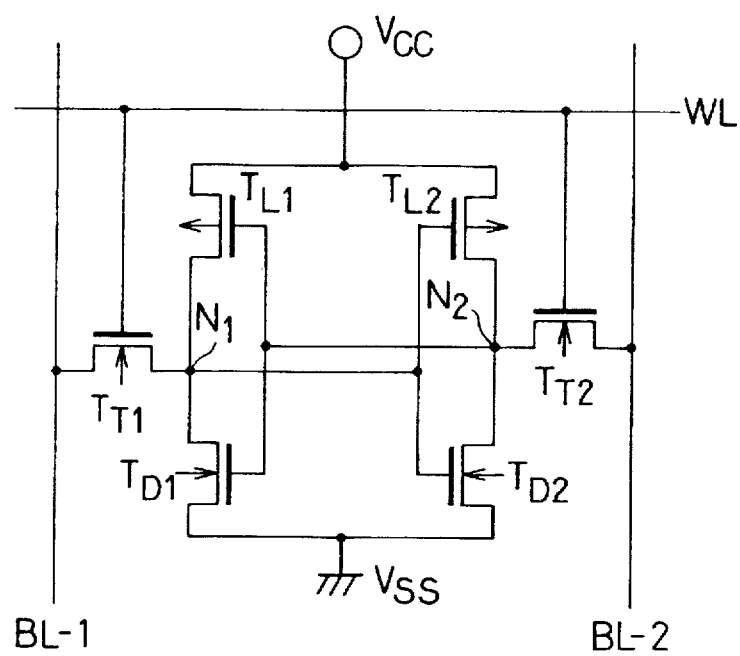
FIG. 1 is a circuit diagram of a memory cell of SRAM having a p-channel MOS transistor as a load element.
Figure 2A:
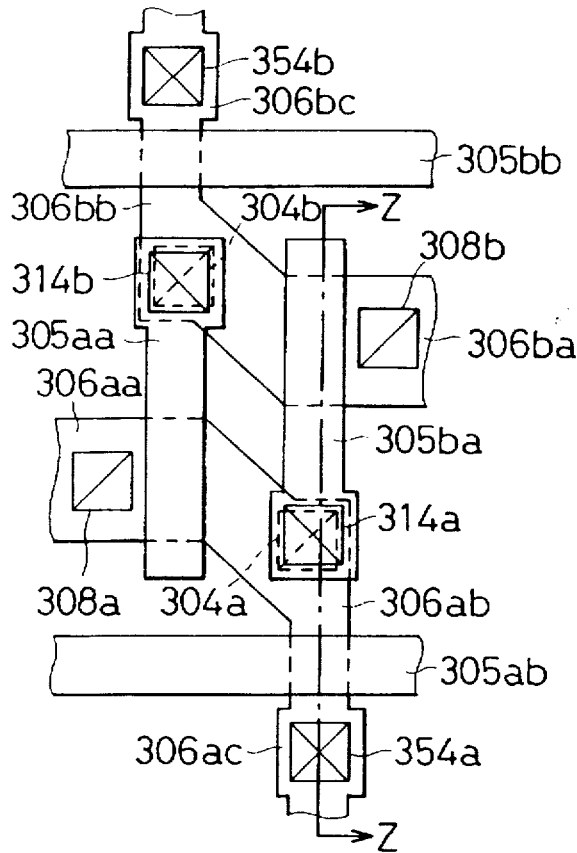
FIGS. 2A and 2B are plan views illustrating a conventional SRAM memory cell having a p-channel TFT as a load element.
Figure 2B:
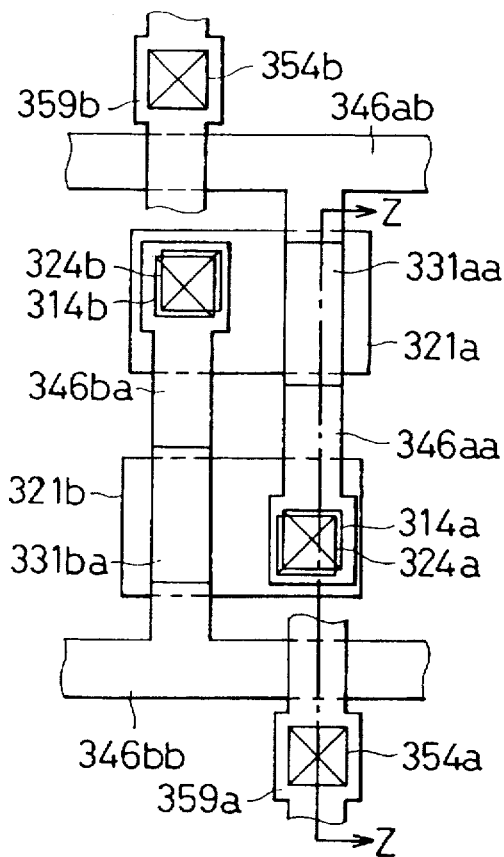
Figure 2C:
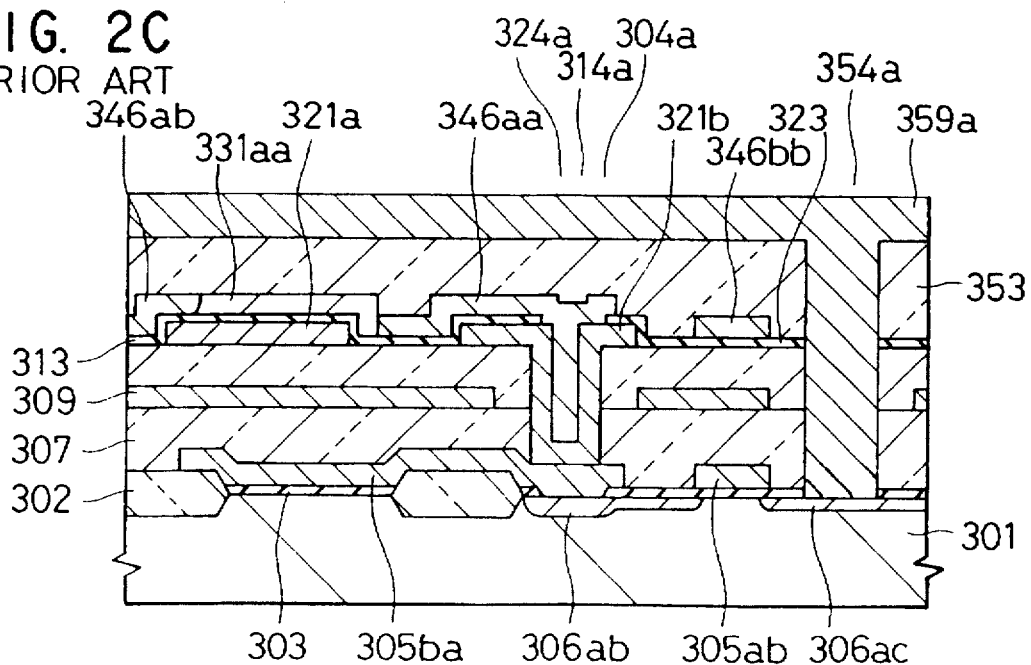
FIG. 2C is a cross-sectional view taken along the lines Z—Z of FIGS. 2A and 2B.
Figure 3A:
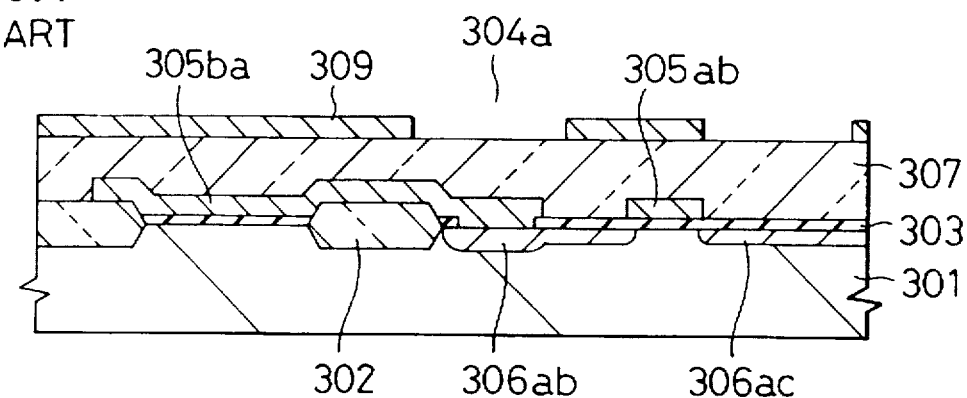
FIGS. 3A to 3E are cross-sectional views taken along the lines Z—Z in FIGS. 2A and 2B, showing respective step of a method of fabricating a conventional SRAM memory cell illustrated in FIGS. 2A to 2C.
Figure 3B:
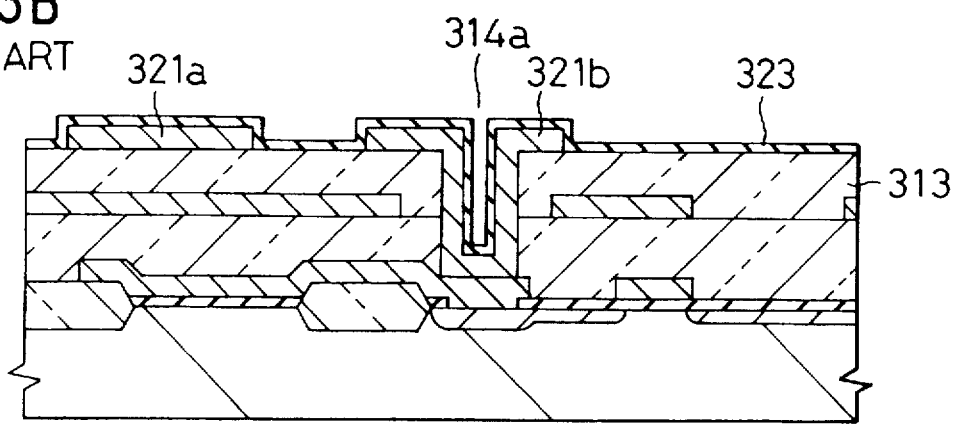
Figure 3C:
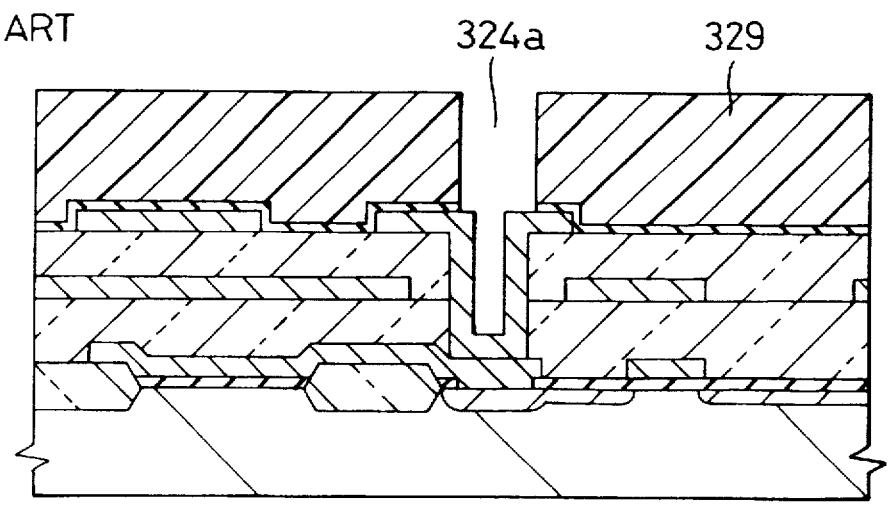
Figure 3D:
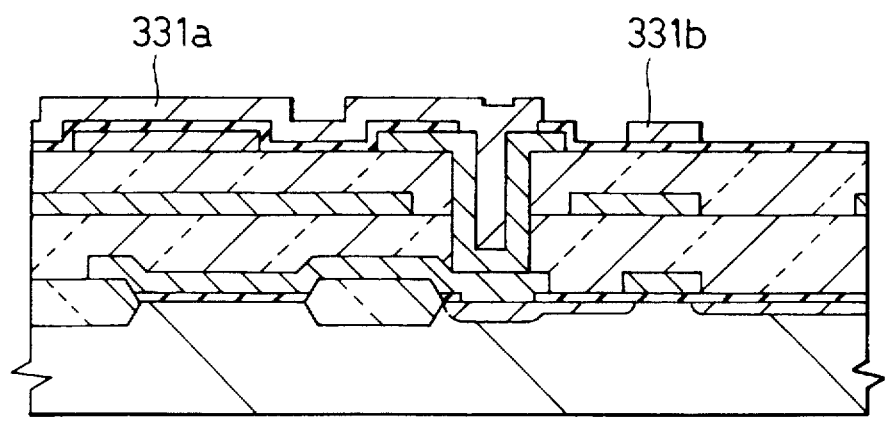
Figure 3E:
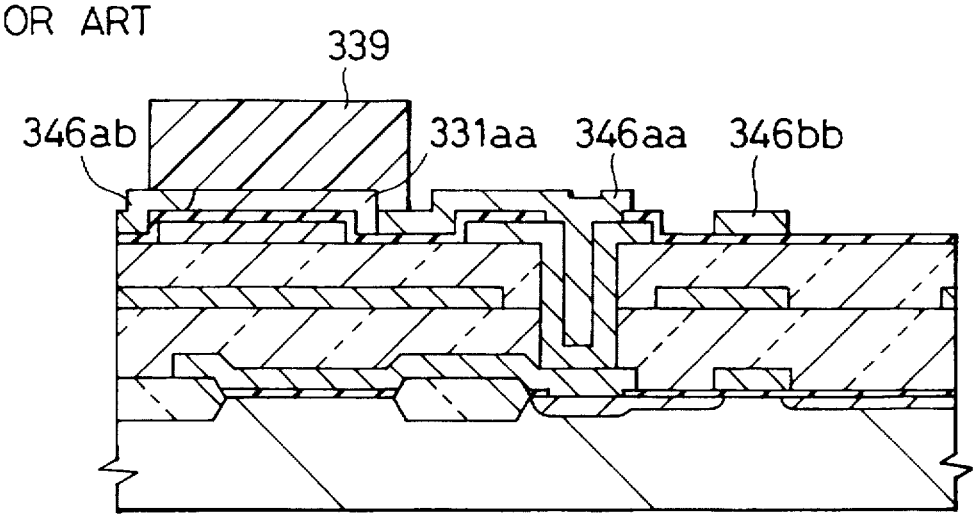
Figure 4:
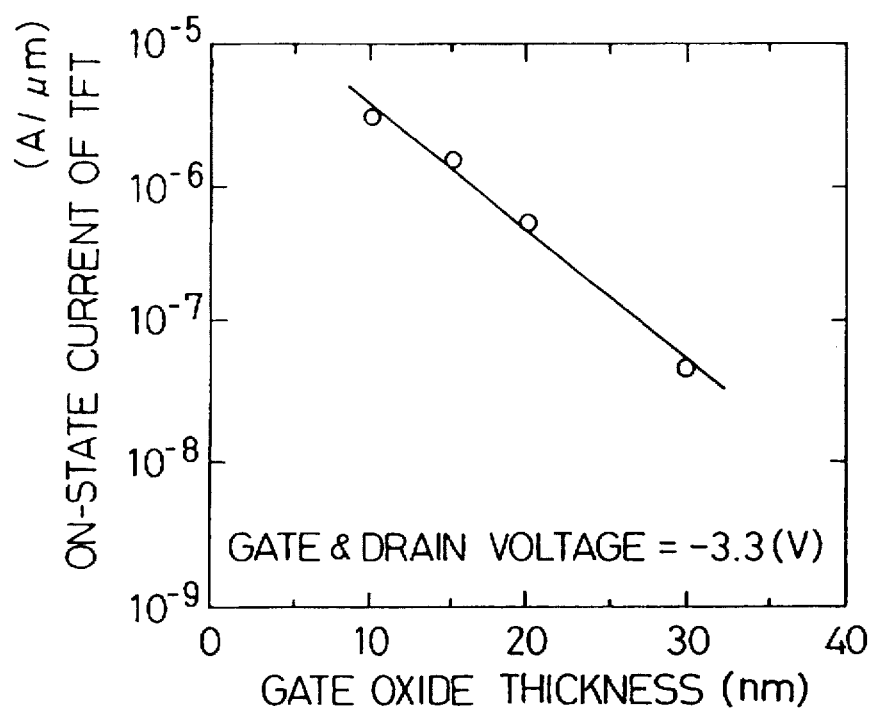
FIG. 4 is a graph showing the dependency of ON-state current of a p-channel TFT on a thickness of a gate insulating film.

Preferred embodiments in accordance with the present invention will be explained hereinbelow with reference to drawings.

With reference to FIGS. 5A, 5B, 5C and 5D, SRAM memory cell made in accordance with the first embodiment of the present invention has a top-gate type p-channel TFT as a load element. The memory cell has the following structure.

On a p-type silicon substrate 101 having the impurity concentration ranging from about $10^{16}$ to about $10^{18}$ cm$^{-3}$ are formed field oxide 102 having a thickness of about 500 nm in device isolation regions by selective oxidation process and gate oxide films 103 having a thickness of about 10 nm in device formation regions by thermal oxidation process. On the silicon substrate 101 are to be formed first and second n-channel MOS transistors $T_{T1}$ and $T_{T2}$ acting as a transferor, and first and second n-channel MOS transistors $T_{D1}$ and $T_{D2}$ acting as a driver.

The silicon substrate 101 is covered with a gate oxide film 103 between the field oxide films 102. The gate oxide film 103 is formed with contact holes 104a and 104b. Each of the contact holes 104a and 104b has a diameter of about 0.4 μm. There are formed a third gate electrode 105aa, a first gate electrode 105ab, a fourth gate electrode 105ba and a second gate electrode 105bb on the p-type silicon substrate 101 through the gate oxide film 103. These gate electrodes 105aa, 105ab, 105ba and 105bb have polycided structure comprising an n-type polysilicon film having a thickness of about 100 nm and a tungsten-silicide film having a thickness of about 150 nm and deposited on the n-type polysilicon film. These gate electrodes 105aa, 105ab, 105ba and 105bb have a gate length of about 0.4 μm. The gate electrodes 105aa and 105ba have a gate width of about 1.0 μm, whereas the gate electrodes 105ab and 105bb have a gate width of about 0.4 μm. Each of the gate electrodes 105aa and 105ba is electrically connected with the p-type silicon substrate 101 through the contact holes 104b and 104a, respectively.

There are formed n-type diffusion layers 106aa, 106ab, 106ac, 106ab, 106bb and 106bc in the device formation regions on the p-type silicon substrate 101 in self-alignment with both the field oxide films 102 and the gate electrodes 105aa, 105ab, 105ba and 105bb. These n-type diffusion layers 106aa, 106ab, 106ac, 106ab, 106bb and 106bc have the impurity concentration ranging from about $10^{20}$ to about $10^{21}$ cm$^{-3}$. Each of overlap margins of the gate electrodes 105aa and 105ba to the contact holes 104b and 104a is approximately 0.2 μm. For instance, the n-type diffusion layer 106ab has a junction depth ranging from about 0.15 to about 0.2 μm just below the gate oxide film 103, whereas ranging from about 0.2 to about 0.3 μm just below the contact hole 104a. As a result, the gate electrodes 105aa and 105ba are electrically connected with the n-type diffusion layers 106bb and 106ab through the contact holes 104b and 104a, respectively.

The gate electrodes 105ab and 105bb acting also as a word line (WL) are electrically connected with each other outside the memory cell. The first transferor n-channel MOS transistor $T_{T1}$ comprises the gate electrode 105ab, the gate insulating film 103, the n-type diffusion layer 106ac acting as a first n-type source region, and the n-type diffusion layer 106ab acting as both first and third n-type drain regions, the second transferor n-channel MOS transistor $T_{T2}$ comprises the gate electrode 105bb, the gate insulating film 103, the n-type diffusion layer 106bc acting as a second n-type source region, and the n-type diffusion layer 106bb acting as both second and fourth n-type drain regions, the first driver n-channel MOS transistor $T_{D1}$ comprises the gate electrode 105aa, the gate insulating film 103, the n-type diffusion layer 106aa acting as a third n-type source region, and the n-type diffusion layer 106ab, and the second driver n-channel MOS transistor $T_{D2}$ comprises the gate electrode 105ba, the gate insulating film 103, the n-type diffusion layer 106ab acting as a fourth n-type source region, and the n-type diffusion layer 106bb.

These four n-channel MOS transistors are covered with an interlayer insulating film 107 which has a flat surface and at least a bottom surface of which is composed of a silicon dioxide film. The interlayer insulating film 107 comprises a two layer structure including a lower layer composed of a silicon dioxide film having a thickness of about 100 nm and an upper layer composed of a BPSG film having a thickness of about 600 nm. The interlayer insulating film 107 has a thickness of about 700 nm at greatest, about 200 nm at smallest, and about 450 nm on the gate electrodes 105aa and 105ba located just above the contact holes 104b and 104a. The interlayer insulating film 107 is formed with first and second ground contact holes 108a and 108b reaching the n-type diffusion layers 106aa and 106ab, respectively. The n-type diffusion layers 106aa and 106ab are electrically connected through the ground contact holes 108a and 108b with a grounding conductor 109 formed on the interlayer insulating film 107. The grounding conductor 109 is made of a tungsten-silicide film having a thickness of about 100 nm, and is formed with an opening at an area through which node contacts and bit contacts are to pass. The opening has a diameter about 0.2 μm greater than the diameter of these holes.

The interlayer insulating film 107 and the grounding conductor 109 are covered with a second interlayer insulating film 113 which has a flat surface and at least a bottom surface of which is composed of a silicon dioxide film. The second interlayer insulating film 113 comprises a two layer structure including a lower layer composed of a BPSG film having a thickness of about 150 nm and an upper layer composed of a silicon dioxide film having a thickness of about 150 nm. The second interlayer insulating film 113 has a portion located above the grounding conductor 109 and having a thickness of about 200 nm. This portion of the second interlayer insulating film 113 comprises a BPSG film having a thickness of 150 nm and a silicon dioxide film having a thickness of about 50 nm. On the second interlayer insulating film 113 are formed two top-gate type p-channel TFTs $T_{L1}$ and $T_{L2}$ each acting as a load.

On the second interlayer insulating film 113 are formed first and second polysilicon film patterns each of which is composed of a first polysilicon film having a thickness of about 40 nm. A first polysilicon film pattern comprises a p-type diffusion region 146aa acting as a first p-type drain region, a first channel region 131aa, and a p-type diffusion region 146ab acting as a first p-type source region, whereas a second polysilicon film pattern comprises a p-type diffusion region 146ab acting as a second p-type drain region, a second channel region 131ba, and a p-type diffusion region 146bb acting as a second p-type source region.

These p-type diffusion regions 146aa, 146ab, 146ab and 146bb have the impurity concentration ranging from about $10^{18}$ to about $10^{20}$ cm$^{-3}$. If the p-type diffusion regions 146aa, 146ab, 146ab and 146bb have the impurity concentration on the order of $10^{21}$ cm$^{-3}$, channel leak in TFT is unpreferably increased. The first and second channel regions 131aa and 131ab are each composed of an n-type polysilicon film having the impurity concentration ranging from about $10^{16}$ to about $10^{18}$ cm$^{-3}$. The p-type diffusion region 146ab has a portion extending above a portion of the gate electrode 105aa at which the gate electrode 105aa is connected to the contact hole 104b, with the first and second interlayer insulating films 113 and 107 being sandwiched therebetween, and the p-type diffusion region 146aa has a portion extending above a portion of the gate electrode 105ba at which the gate electrode 105ba is connected to the contact hole 104a, with the first and second interlayer insulating films 113 and 107 being sandwiched therebetween. The p-type diffusion regions 146ab and 146bb constitute a part of a power source line, and are electrically connected with each other outside the memory cell.

The second interlayer insulating film 113 together with the first and second polysilicon film patterns is covered with a gate insulating film 133 composed of a silicon dioxide film having a thickness of about 15 nm. On the gate insulating film 133 are formed third and fourth polysilicon film patterns 135a and 135b composed of a second polysilicon film including n- or p-type impurities at the concentration ranging from $10^{16}$ to $10^{20}$ cm$^{-3}$ and having a thickness of about 100 nm. The third polysilicon film pattern 135a has a portion which covers the channel region 131aa through the gate insulating film 133 and extends above a portion of the gate electrode 105aa at which the gate electrode 105aa is connected to the contact hole 104b, with the first and second interlayer insulating films 113 and 107 being sandwiched therebetween. The fourth polysilicon film pattern 135a has a portion which covers the channel region 131ba through the gate insulating film 133 and extends above a portion of the gate electrode 105ba at which the gate electrode 105ba is connected to the contact hole 104a, with the gate insulating film 133 and the first and second interlayer insulating films 113 and 107 being sandwiched therebetween.

There are formed a first node contact hole 138b passing through the polysilicon film pattern 135a, gate insulating film 133, p-type diffusion region 146ab, second interlayer insulating film 113, first interlayer insulating film 107 and gate insulating film 103 and reaching the gate electrode 105aa, and a second node contact hole 138a passing through the polysilicon film pattern 135b, gate insulating film 133, p-type diffusion region 146aa, second interlayer insulating film 113, first interlayer insulating film 107 and gate oxide film 103 and reaching the gate electrode 105ba. These node contact holes 138a and 138b have a diameter of about 0.4 μm.

A first conductive film pattern or tungsten-silicide film pattern 141a composed of a conductive tungsten-silicide film having a thickness of about 100 nm selectively covers the polysilicon film pattern 135a, and is electrically connected with the gate electrode 105aa through the node contact hole 138b. A fifth gate electrode 145a comprises the tungsten-silicide film pattern 141a and the polysilicon film pattern 135a. A second conductive film pattern or tungsten-silicide film pattern 141b composed of the common conductive tungsten-silicide film selectively covers the polysilicon film pattern 135b, and is electrically connected with the gate electrode 105ba through the node contact hole 138a. A sixth gate electrode 145b comprises the tungsten-silicide film pattern 141b and the polysilicon film pattern 135b. The fifth and sixth gate electrodes 145a and 145b have a gate length of about 0.8 μm and a gate width of about 0.4 μm.

A first p-channel TFT $T_{L1}$ acting as a load comprises the fifth gate electrode 145a, the gate insulating film 133, the p-type diffusion region 146aa, the channel region 131aa and the p-type diffusion region 146ab. A second p-channel TFT $T_{L1}$ acting as a load comprises the sixth gate electrode 145b, the gate insulating film 133, the p-type diffusion region 146ab, the channel region 131ba and the p-type diffusion region 146bb. The fifth gate electrode 145a, the p-type diffusion region 146ab and the gate electrode 105aa connected to the n-type diffusion layer 106bb are connected to one another through the tungsten-silicide film pattern 141a and the node contact hole 138b to thereby form a second node $N_2$. Similarly, the sixth gate electrode 145b, the p-type diffusion region 146aa and the gate electrode 105ba connected to the n-type diffusion layer 106ab are connected to one another through the tungsten-silicide film pattern 141b and the node contact hole 138a to thereby form a first node $N_1$.

In the embodiment, the tungsten-silicide film is used as a conductive film. It should be noted that a material of which a conductive film is made is not to be limited to the tungsten-silicide film. The conductive film may be composed of a refractory metal film such as a tungsten or molybdenum film, a refractory metal silicide film such as a molybdenum silicide film and a titanium silicide film, or a titanium nitride film or a titanium tungsten film.

The second interlayer insulating film 113, the first and second p-channel TFTs and the gate insulating film 133 are covered with a third interlayer insulating film 153 which has a flat surface and at least a bottom surface of which is composed of a silicon dioxide film. The third interlayer insulating film 153 comprises a two layer structure including a lower layer composed of a silicon dioxide film having a thickness of about 100 nm and an upper layer composed of a BPSG film having a thickness of about 400 nm. There are formed a first bit contact hole 154a passing through the third interlayer insulating film 153, the gate insulating film 133, the second interlayer insulating film 113, the first interlayer insulating film 107 and the gate insulating film 103 and reaching the n-type diffusion layer 106ac, and a second bit contact hole 154b passing through the third interlayer insulating film 153, the gate insulating film 133, the second interlayer insulating film 113, the first interlayer insulating film 107 and the gate insulating film 103 and reaching the n-type diffusion layer 106bc. These bit contact holes 154a and 154b have a diameter of about 0.4 μm. On the third interlayer insulating film 153 are formed a pair of bit lines 159a (BL-1) and 159b (BL-2) which are electrically connected with the n-type diffusion layers 106ac and 106bc through the bit contact holes 154a and 154b, respectively.

Although the grounding conductor 109 is disposed on the first interlayer insulating film 107 in the embodiment, the position and configuration of the grounding conductor 109 is not to be limited to those of the embodiment. For instance, a p-channel TFT acting as a load may be formed on the first interlayer insulating film 107, and the grounding conductor 109 may be formed on either the second interlayer insulative layer 113 or the third interlayer insulative layer 153.

Figure 5A:
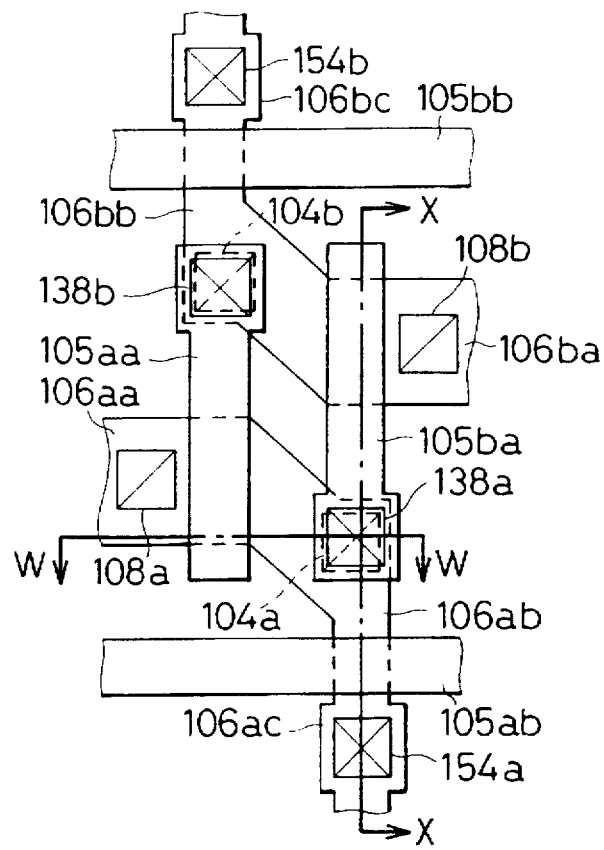
FIGS. 5A and 5B are plan views illustrating a semiconductor memory device fabricated in accordance with the first embodiment of the present invention.
Figure 5B:
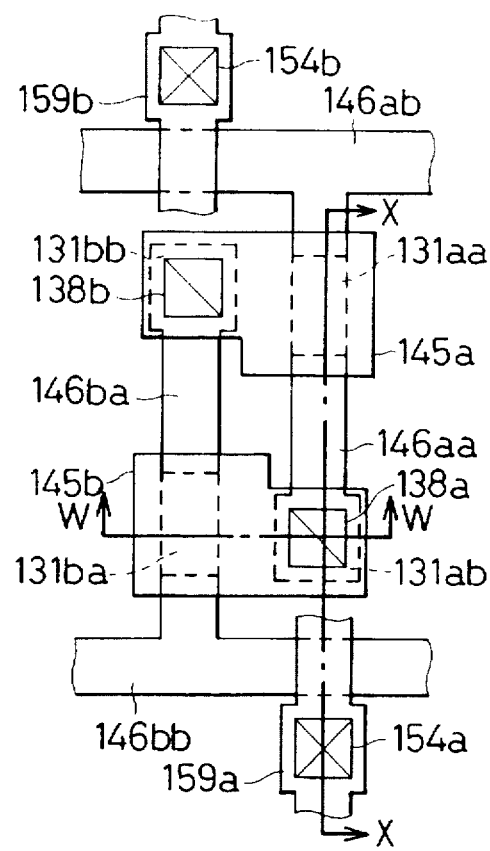

With reference to FIGS. 5A to 5D and FIGS. 6A to 6F which are cross-sectional views taken along the lines X—X of FIGS. 5A and 5B, the above mentioned SRAM memory cell of the first embodiment is manufactured in accordance with 0.4 μm design rule as follows.

On the p-type silicon substrate 101 are formed the field oxide films 102 having a thickness of about 500 nm in device isolation regions by selective oxidation, and the gate oxide films 103 having a thickness of about 10 nm in device formation regions by thermal oxidation. The contact holes 104a and 104b are formed at a certain location in the gate oxide film 103 by wet etching using buffered hydrofluoric acid. The contact holes 104a and 104b have a diameter of about 0.4 μm. The reason why the wet etching is allowed to use for forming the contact holes 104a and 104b is that there is no difficulties, even if a diameter of the contact holes is made slightly too large due to over etching.

Then, an n-type polysilicon film having a thickness of about 100 nm is deposited over a resultant by LPCVD and ion-implanting, and successively a tungsten-silicide film having a thickness of about 150 nm is deposited thereover by sputtering. The reason why the tungsten-silicide film has a thicker thickness is to decrease a resistance of a gate electrode which is to be formed of the laminated layers of the n-type polysilicon film and the tungsten-silicide film. The thus laminated films are patterned, for instance, by anisotropic dry etching in which etching gas including $SF_6$, HBr and $Cl_2$ is to be used, to thereby form the polycided gate electrodes 105aa, 105ab, 105ba and 105bb. These gate electrodes 105aa, 105ab, 105ba and 105bb have a gate length of about 0.4 μm. The gate electrodes 105aa and 105ba have a gate width of about 0.1 μm, whereas the gate electrodes 105ab and 105bb have a gate width of about 0.4 μm. The gate electrodes 105aa and 105ba are electrically connected with the p-type silicon substrate 101 through the contact holes 104b and 104a, respectively. For instance, an overlap margin between a distal end of the gate electrode 105aa and the gate oxide film 103 within the contact hole 104b is about 0.2 μm. In other words, for instance, the gate electrode 105aa is shaped in 1.0 μm square within the contact hole 104b. The reason why the gate electrodes 105aa and 105ba are enlarged in alignment with the contact holes 104b and 104a is that upper surfaces of the gate electrodes 105aa and 105ba make bottom surfaces of the node contact holes.

Then, there are formed the n-type diffusion layers 106aa, 106ab, 106ac, 106ab, 106bb and 106bc on the p-type silicon substrate 101, for instance, by arsenic (As) ion-implanting using the field oxide films 102 and the gate electrodes 105aa, 105ab, 105ba and 105bb as a mask. The n-type diffusion layers 106aa, 106ab, 106ac, 106ab, 106bb and 106bc have the impurity concentration ranging from about $10^{20}$ to about $10^{21}$ cm$^{-3}$. For instance, the n-type diffusion layer to be formed just below the contact hole 104a by diffusion from the polycided tungsten-silicide film and the n-type polysilicon film has a junction depth ranging from 0.2 to 0.3 μm, whereas the n-type diffusion layer to be formed just below the gate oxide film 103 by ion-implanting has a junction depth ranging from 0.2 to 0.3 μm. Thus, these two n-type diffusion layers are electrically connected with each other by horizontal diffusion to thereby form the n-type diffusion layer 106ab.

Figure 5C:
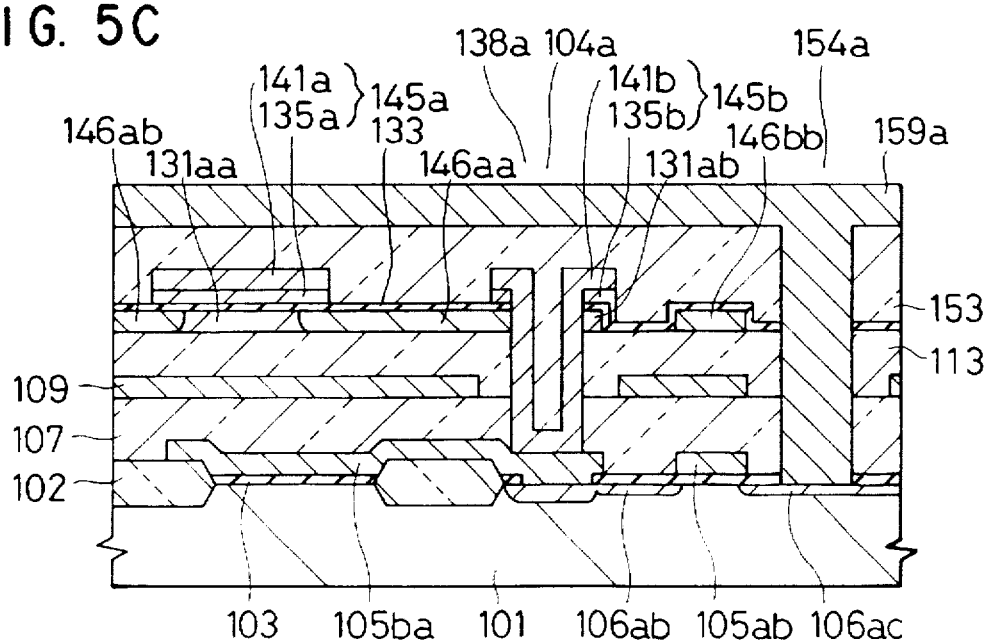
FIG. 5C is a cross-sectional view taken along the lines X—X in FIGS. 5A and 5B.
Figure 5D:
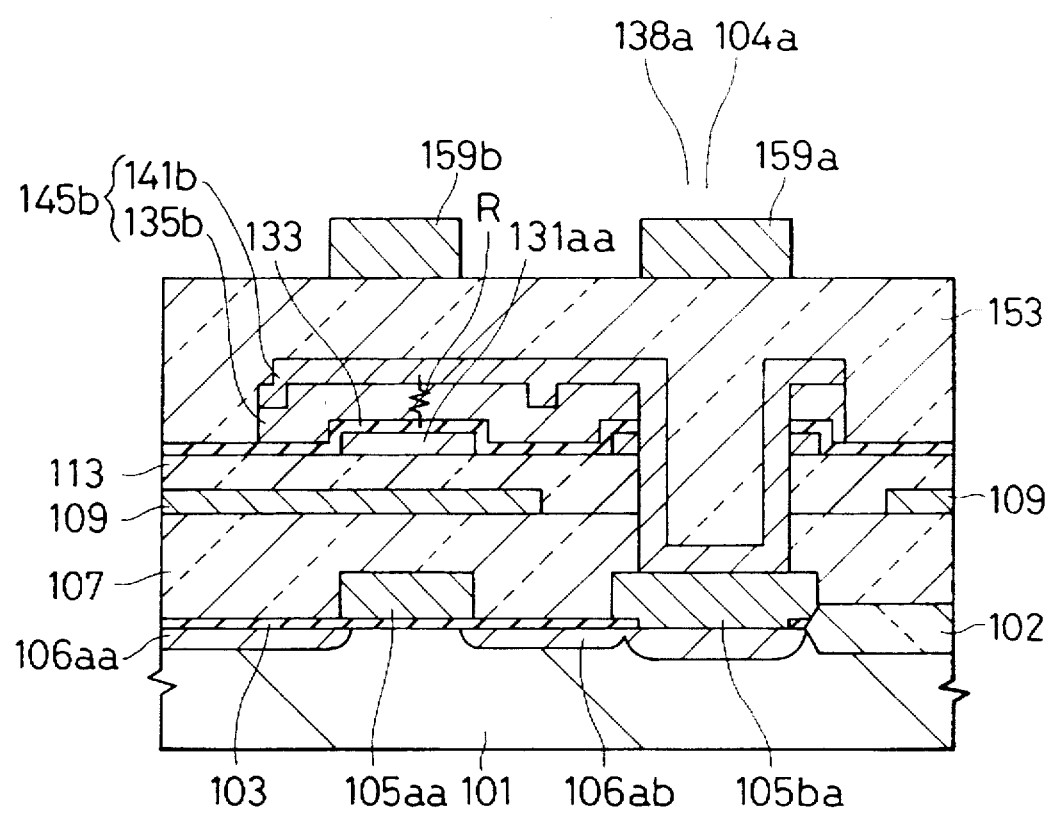
FIG. 5D is a cross-sectional view taken along the lines W—W in FIGS. 5A and 5B.
Figure 6A:
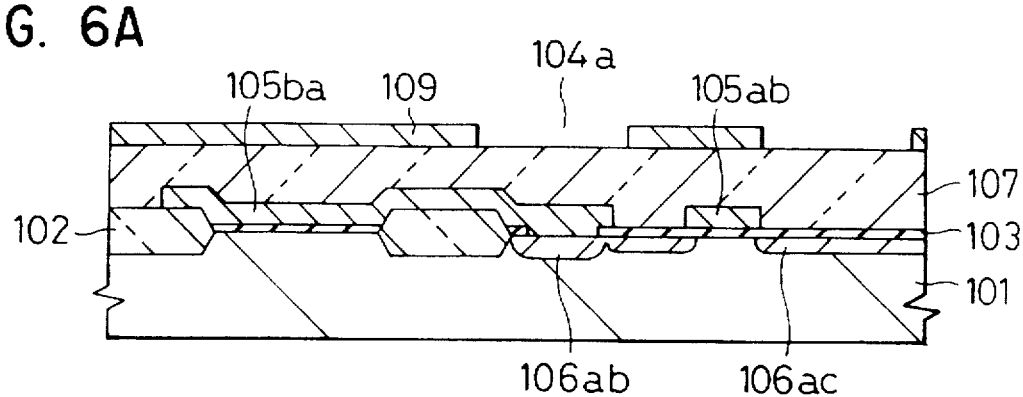
FIGS. 6A to 6F are cross-sectional views taken along the lines X—X in FIGS. 5A and 5B, showing respective step of a method of fabricating the semiconductor memory device illustrated in FIGS. 5A to 5D.

Then, over a resultant is formed the first interlayer insulating film 107 which has a flat surface and at least a bottom surface of which is made of a silicon dioxide film by LPCVD and, for instance, chemical and mechanical polishing (CMP). The first interlayer insulating film 107 is formed as follows, for instance. A silicon dioxide film having a thickness of about 100 nm is first deposited over a resultant by LPCVD, and then a BPSG film having a thickness of about 600 nm is deposited over the silicon dioxide film by LPCVD. Then, re-flow treatment is carried out at temperature in the range of 800° C. to 850° C., and subsequently, a surface of a resultant is flattened by CMP. Then, the ground contact holes 108a and 108b reaching the n-type diffusion layers 106aa and 106ab are formed in the first interlayer insulating film 107. Then, a tungsten-silicide film is deposited over a resultant. Then, there is formed an opening in a certain area of the tungsten-silicide film, for instance, by anisotropic dry etching in which etching gas composed of SF6, HBr and C12 is used. Herein, the certain area has about 0.2 µm greater diameter than diameters of the node contact holes and bit contact holes to be formed in subsequent steps. The opening has an inner diameter of about 1.0 µm. Thus, there is formed the grounding conductor 109 electrically connected with the n-type diffusion layers 106aa and 106ab through the ground contact holes 108a and 108b, as illustrated in FIGS. 5A, 5C and 6A.

Then, over a resultant is formed by LPCVD and CMP the second interlayer insulating film 113 which has a flat surface and at least a bottom surface of which is made of a silicon dioxide film. The second interlayer insulating film 113 is formed as follows, for instance. A BPSG film having a thickness of about 150 nm is deposited by LPCVD. Then, re-flow treatment is carried out, and subsequently, a silicon dioxide film having a thickness of about 150 nm is deposited over a resultant by LPCVD. Then, a surface of the silicon dioxide film is flattened by CMP. Then, an amorphous silicon film having a thickness of about 40 nm is deposited by LPCVD. A resultant is thermally annealed at about 600° C. for about 10 hours to thereby cause the amorphous silicon film to change into a polysilicon film. Then, n-type impurities are ion-implanted into the polysilicon film. Thus, there is formed the n-type polysilicon film (first polysilicon film) having the impurity concentration in the range of $10^{16}$ to $10^{18}$ cm$^{-3}$.

Figure 6B:
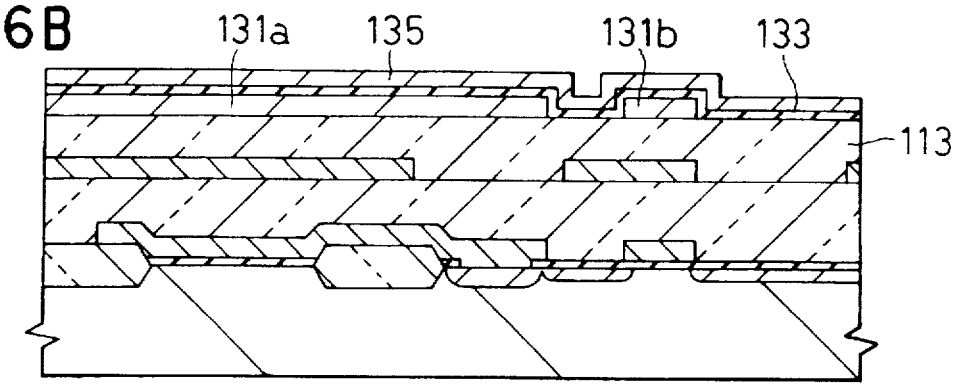
Figure 6C:
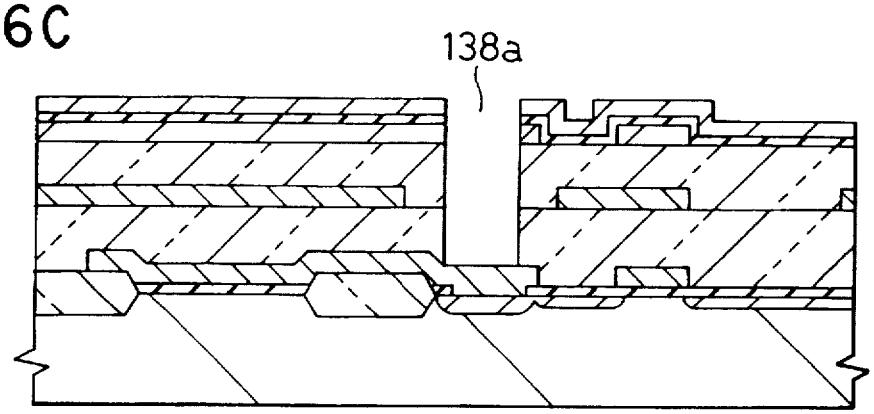

The thus formed first polysilicon film is patterned, for instance, by anisotropic dry etching in which etching gas composed of HBr and Cl$_2$ is used, to thereby form the first and second polysilicon film patterns 131a and 131b. The first polysilicon film pattern 131a has an end extending through the second and first interlayer insulating films 113 and 107 above a portion of the gate electrode 105ba covering the contact hole 104a. The second polysilicon film pattern 131b has an end extending through the second and first interlayer insulating films 113 and 107 above a portion of the gate electrode 105aa covering the contact hole 104b. Then, over a resultant is deposited by LPCVD the gate insulating film 133 having a thickness of about 15 nm and composed of a silicon dioxide film (HTO film). Then, a polysilicon film having a thickness of about 100 nm is deposited over a resultant by LPCVD. N- or p-type impurities at the concentration in the range of $10^{16}$ to $10^{19}$ cm$^{-3}$ are doped by ion-implanting into the polysilicon film to thereby form the second polysilicon film 135, as illustrated in FIG. 6B.

Then, the polysilicon film 135, the gate insulating film 133, the polysilicon film patterns 131a and 131b, the second interlayer insulating film 113, and the first interlayer insulating film 107 are successively anisotropically etched using photoresist films (not illustrated) as a mask, to thereby form the first and second node contact holes 138a and 138b. The first node contact hole 138a reaches the gate electrode 105ba generally just above the contact hole 104a, whereas the second node contact hole 138b reaches the gate electrode 105aa generally just above the contact hole 104b, as illustrated in FIGS. 5A to 5C and 6C. These node contact holes 138a and 138b have a diameter of about 0.4 µm. A margin of the polysilicon film patterns 131a and 131b to the node contact holes 138a and 138b is about 0.2 µm.

The anisotropic etching for the formation of the node contact holes 138a and 138b is carried out as follows. First, the polysilicon film 135 is anisotropically dry-etched by using etching gas composed of HBr and Cl$_2$. Then, the gate insulating film 133 is anisotropically dry-etched by using etching gas composed of CHF$_3$. Then, the polysilicon film patterns 131a and 131b are anisotropically dry-etched by using etching gas composed of HBr and Cl$_2$. Then, the second and first interlayer insulating films 113 and 107 are anisotropically dry-etched in succession by using etching gas composed of CHF$_3$. Since the second and first interlayer insulating films 113 and 107 are flattened at their surfaces, it is possible to have adequate controllability of the anisotropic dry etching. The removal of the above mentioned photoresist is carried out preferably by oxygen plasma enhanced ashing, because the photoresist is exposed to the anisotropic etching for a relatively long period of time. Accordingly, it is necessary to carry out washing with acid and surface treatment with weak hydrofluoric acid subsequently to the ashing. In the embodiment, since the gate insulating film 133 is not in direct contact with the photoresist, the gate insulating film 133 is slightly under-cut on the surface treatment with weak hydrofluoric acid, however, it is possible to avoid the gate insulating film 133 from being made locally thin in thickness.

Figure 6D:
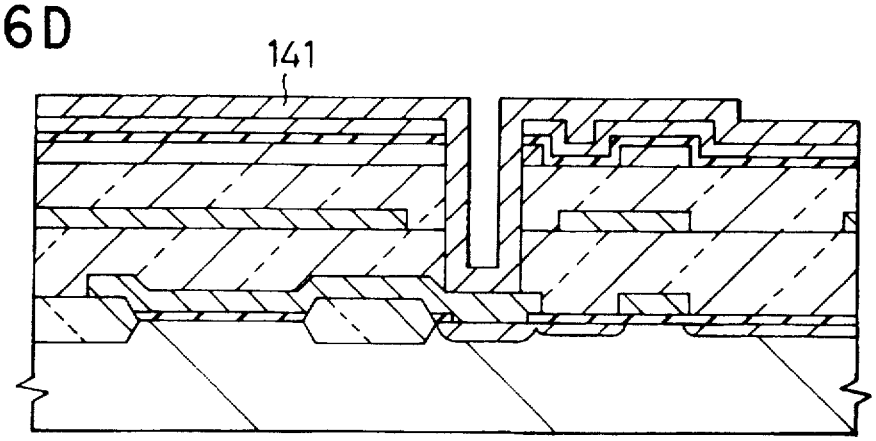
Figure 6E:
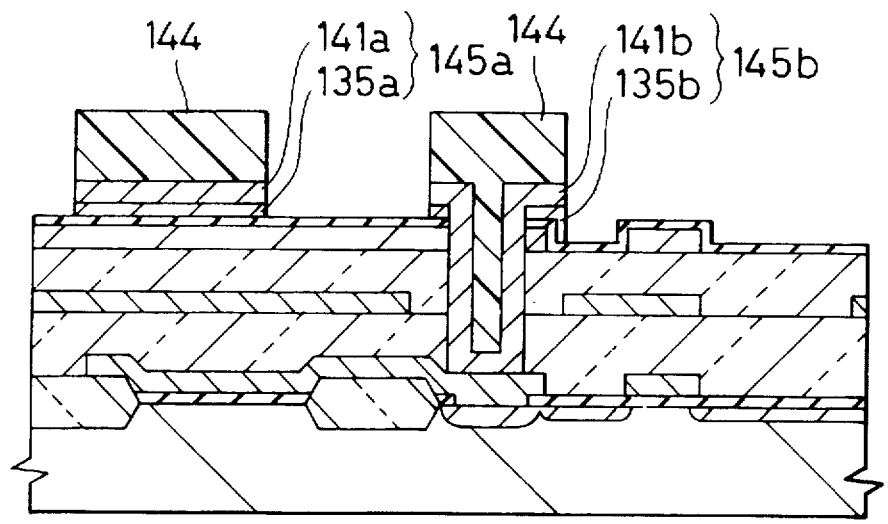
Figure 6F:
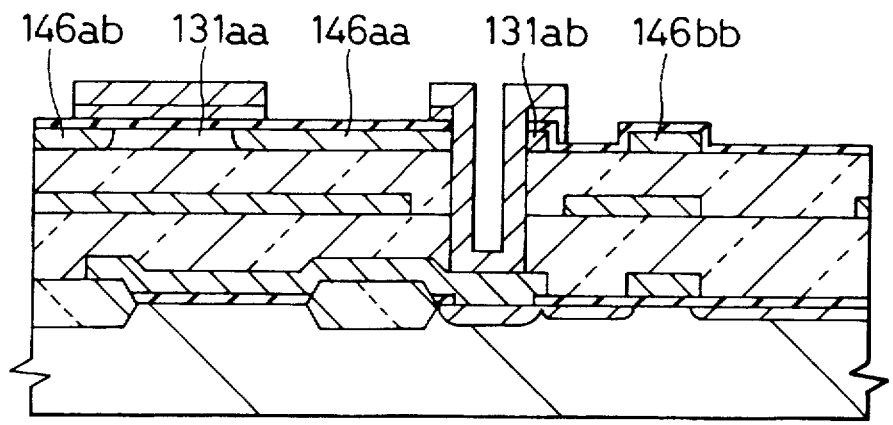

Then, the tungsten-silicide film 141, which is an electrically conductive film, is deposited over a resultant by LPCVD, as illustrated in FIG. 6D. In LPCVD, source gas composed of WF$_6$ and SiH$_2$Cl$_2$ is used, and WF$_6$ is reduced by SiH$_2$Cl$_2$ with the result of formation of the tungsten-silicide film 141. Sputtering, which has poor coverage for irregularities, is not suitable for the formation of the tungsten-silicide film 141, because the node contact holes 138a and 138b have a relatively high aspect ratio of about 2.3, and also because the gate insulating film 133 is under-cut. It is also unsuitable to fill the node contact holes 138a and 138b with a selectively grown tungsten film, because the polysilicon film 135 is exposed to a surface of the tungsten-silicide film 141 and the polysilicon film patterns 131a and 131b are exposed to a sidewall of the node contact holes 138a and 138b. When other materials than a tungsten-silicide film are to be used as an electrically conductive film, it is not preferable to use sputtering, and it is preferable to use LPCVD, MOCVD or MBE for deposition. For instance, a molybdenum silicide film can be deposited by LPCVD in which MoCl$_5$ is reduced with SiH$_4$.

Then, the tungsten silicide film 141 and the polysilicon film 135 are successively patterned by anisotropic etching in which the photoresist film 144 is used as a mask, to from both the fifth gate electrode 145a having a polycided structure comprising the third polysilicon film pattern 135a and the tungsten silicide film pattern 141a as the first conductive film pattern is deposited thereon, and the sixth gate electrode 145b having a polycided structure comprising the fourth polysilicon film pattern 135b and the tungsten silicide film pattern 141b as the second conductive film pattern deposited thereon. The tungsten silicide film pattern 141a is electrically connected with the gate electrode 105aa through the node contact hole 138b, thereby the gate electrode 145a being electrically connected with the gate electrode 105aa. Similarly, the tungsten silicide film pattern 141b is electrically connected with the gate electrode 105ba through the node contact hole 138a, thereby the gate electrode 145b being electrically connected with the gate electrode 105ba through the node contact hole 138a, as illustrated in FIGS. 5A to 5C and 6E. Each of overlap margins of the gate electrodes 145b and 145a to the node contact holes 138a and 138b is about 0.2 µm. Each of the gate electrodes 145a and 145b has a gate length of about 0.8 µm, and a gate width of about 0.4 µm.

Then, boron is ion-implanted into a resultant by using the gate electrodes 145a and 145b as a mask. The boron ion-implanting may be carried out either with the photoresist 144 unremoved or with the photoresist 144 removed. Subsequently to the boron ion-implanting and the removal of the photoresist 144, rapid thermal annealing (RTA) is carried out at 1000° C. for 10 seconds. Thus, in the first polysilicon film pattern 131a are formed the p-type diffusion region 146aa acting as the first p-type drain region, and the p-type diffusion region 146ab constituting a part of the power source line and acting as the first p-type source region. Concurrently, the first channel region 131aa remains unchanged substantially below the gate electrode 145a, and the n-type polysilicon film pattern 131a b remains unchanged partially around the node contact hole 138b. In the second polysilicon film pattern 131b are formed the p-type diffusion region 146ab acting as the second p-type drain region, and the p-type diffusion region 146bb constituting a part of the power source line and acting as the second p-type source region. Concurrently, the second channel region 131ab remains unchanged substantially below the gate electrode 145b, and the n-type polysilicon film pattern 131bb remains unchanged partially around the node contact hole 138a.

The rapid thermal annealing (RTA) causes the p-type diffusion regions 146aa and 146ab to horizontally expand by about 0.2 to 0.25 μm, which is almost the same as the overlap margin (about 0.2 μm) of the gate electrodes 145b and 145a to the node contact holes 138a and 138b. However, since boron having been added into the tungsten silicide film patterns 141b and 141a diffuse out of a sidewall of the node contact holes 138a and 138b, the p-type diffusion regions 146aa and 146ab come to reach the sidewall of the each of the node contact holes 138a and 138b. The p-type diffusion region 146ab is connected with the tungsten silicide film pattern 141a at the sidewall of the node contact hole 138b, thereby the p-type diffusion region 146ab, the gate electrode 145a, the gate electrode 105aa, and the n-type diffusion layer 106bb being connected with one another. Similarly, the p-type diffusion region 146aa is connected with the tungsten silicide film pattern 141b at the sidewall of the node contact hole 138a, thereby the p-type diffusion region 146aa, the gate electrode 145b, the gate electrode 105ba, and the n-type diffusion layer 106ab being connected with one another, as illustrated in FIGS. 5A to 5C and 6F.

Then, over a resultant is formed by LPCVD and CMP the third interlayer insulating film 153 which has a flat surface and at least a bottom surface of which is made of a silicon dioxide film. The third interlayer insulating film 153 is formed as follows, for instance. A silicon dioxide film having a thickness of about 100 nm is deposited by LPCVD. Then, a BPSG film having a thickness of about 400 nm is deposited over a resultant by LPCVD. Then, a surface of the BPSG film is flattened by CMP subsequently to re-flow treatment. The third interlayer insulating film 153, the gate insulating film 133, the second interlayer insulating film 113, the first interlayer insulating film 107 and the gate oxide film 103 are successively anisotropically dry-etched to thereby form the first bit contact hole 154a reaching the n-type diffusion layer 106ac and the second bit contact hole 154b reaching the n-type diffusion layer 106bc. Only insulating films composed of silicon dioxide family are etched by the anisotropic dry etching. The bit contact holes 154a and 154b have a diameter of about 0.4 μm, and an aspect ratio of about 3.8.

Then, a plug tungsten film (not illustrated) is selectively grown in the bit contact holes 154a and 154b by high-vacuum LPCVD in which WF$_6$ is reduced with SiH$_4$. The reason why high vacuum LPCVD is selected is that the bit contact holes 154a and 154b have a high aspect ratio. Then, over a resultant are successively deposited a titanium film, a titanium nitride film and an aluminum film. These aluminum film, titanium nitride film and titanium film are successively patterned to thereby form a pair of the bit lines 159a and 159b. The bit line 159a is electrically connected with the n-type diffusion layer 106ac through the contact hole 154a, whereas the bit line 159b is electrically connected with the n-type diffusion layer 106bc through the contact hole 154b, as illustrated in FIGS. 5A to 5C.

A load element manufactured in accordance with the above mentioned first embodiment is a top-gate type p-channel TFT having a gate electrode comprising a polysilicon film and a tungsten silicide film deposited on the polysilicon film. Thus, it is now possible to cause the tungsten silicide film to constitute a part of the cross connection of a pair of CMOS inverters. The connection between a gate electrode of an n-channel MOS transistor constituting one of the CMOS inverters and a gate electrode of a p-channel TFT is accomplished by a tungsten silicide film extending from the gate electrode of the p-channel TFT via a node contact hole formed in an interlayer insulating film. The tungsten silicide film causes the gate electrodes to be connected with a p-type drain region of a p-channel TFT of the other CMOS inverter through the common node contact hole.

The structure of the SRAM memory cell fabricated in accordance with the embodiment ensures that etching for a gate insulating film of a p-channel TFT to be carried out for the formation of the node contact holes is carried out with the gate insulating film being covered with a polysilicon film which constitutes a lower layer of a gate electrode of the p-channel TFT. Thus, the gate insulating film is presented from being damaged or contaminated when etched for the formation of the node contact holes, and in addition, it is possible to prevent the gate insulating film from being made locally thin in thickness due to washing with acid and surface treatment with weak hydrofluoric acid to be carried out subsequently to the etching. As a result, it is possible to avoid the significant reduction of voltage resistance of a gate electrode of a p-channel TFT.

The embodiment provides an additional advantage that it is possible to form a resistance in a gate electrode by decreasing the impurity concentration of a lower layer of the gate electrode comprising two deposited layers. For instance, the article C-427 in the publication having been issued for the electronic communication association autumn meeting 1991 has suggested to cause a gate electrode of TFT to have a high resistance, and to provide an delay circuit in order to enhance soft error immunity of TFT type SRAM memory cell. However, in the above mentioned Japanese Unexamined Patent Publication No. 5-251666, an upper gate electrode of TFT acts as an electrode of a node contact which connects a drain region of the TFT with a bulk transistor, and hence, if the upper gate electrode of TFT is made to have a high resistance, there would arise a problem that the ability of supplying current to a cell node of the TFT is deteriorated. On the other hand, in the present invention, an upper film of a gate electrode which is to act as an electrode of a node contact is made to have a low resistance, and the impurity concentration in a lower film of the gate electrode is decreased, thereby making it possible to form a resistance R (see FIG. 5D) in the gate electrode. Thus, RC delay circuit for enhancing soft error immunity can be readily configured, and it is possible to keep the ability of supplying current to a cell node of the TFT from being deteriorated.

Figure 7A:
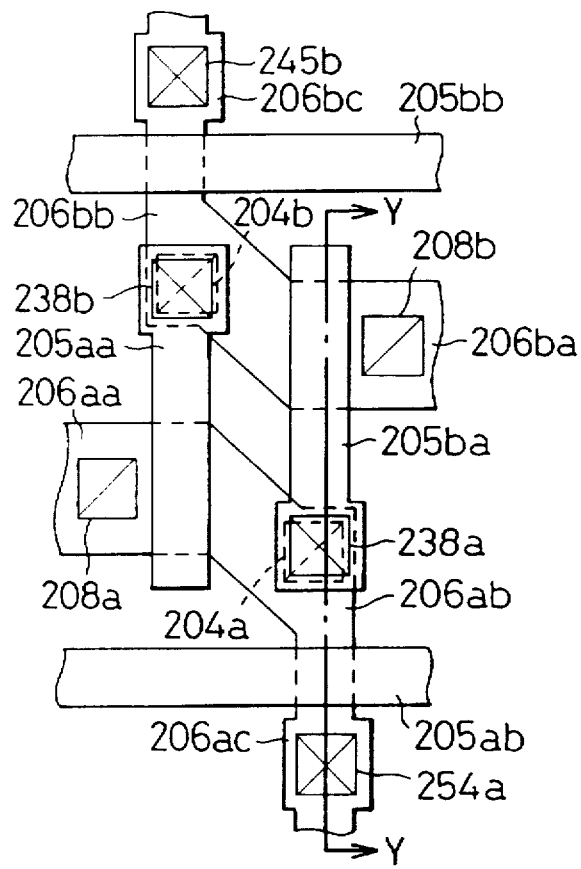
FIGS. 7A and 7B are plan views illustrating a semiconductor memory device fabricated in accordance with the second embodiment of the present invention.
Figure 7B:
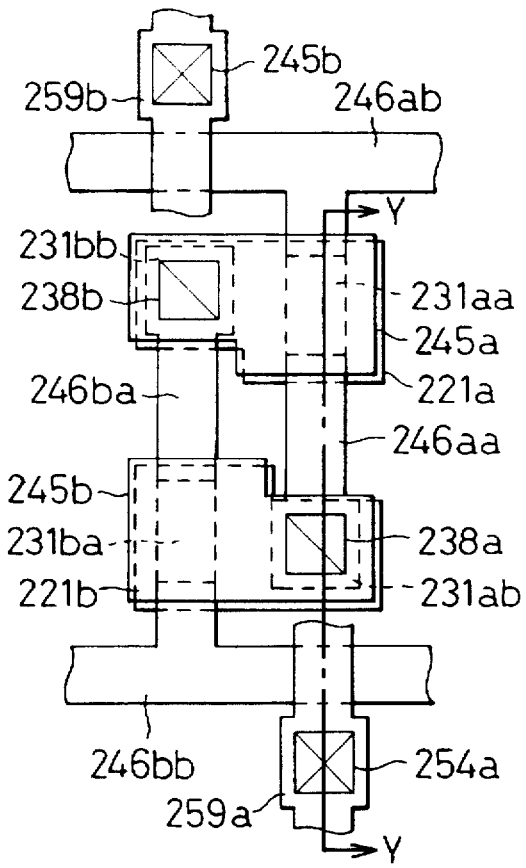
Figure 7C:
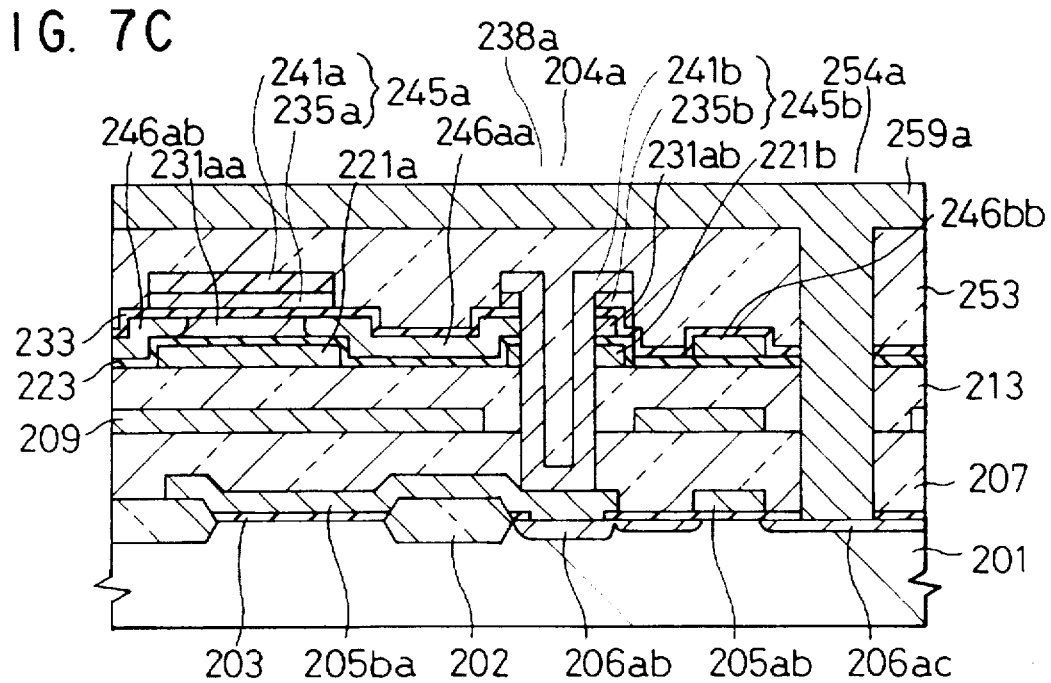
FIG. 7C is a cross-sectional view taken along the lines Y-Y in FIGS. 5A and 5B.

With reference to FIGS. 7A, 7B and 7C, SRAM memory cell made in accordance with the second embodiment of the present invention has a dual gate type p-channel TFT as a load element unlike the first embodiment. The memory cell has the following structure.

On a p-type silicon substrate 201 having the impurity concentration ranging from about $10^{16}$ to about $10^{18}$ cm$^{-3}$ are formed field oxide films 202 having a thickness of about 500 nm in device isolation regions by selective oxidation process and gate oxide films 203 having a thickness of about 10 nm in device formation regions by thermal oxidation process. On the silicon substrate 201 are to be formed first and second n-channel MOS transistors $T_{T1}$ and $T_{T2}$ acting as a transferor, and first and second n-channel MOS transistors $T_{D1}$ and $T_{D2}$ acting as a driver.

The silicon substrate 201 is covered with a gate oxide film 203 between the field oxide films 202. The gate oxide film 203 is formed with contact holes 204a and 204b. Each of the contact holes 204a and 204b has a diameter of about 0.4 µm. There are formed a third gate electrode 205aa, a first gate electrode 205ab, a fourth gate electrode 205ba and a second gate electrode 205bb on the p-type silicon substrate 201 through the gate oxide film 203. These gate electrodes 205aa, 205ab, 205ba and 205bb have polycided structure comprising an n-type polysilicon film having a thickness of about 100 nm and a tungsten-silicide film having a thickness of about 150 nm and deposited on the n-type polysilicon film. These gate electrodes 205aa, 205ab, 205ba and 205bb have a gate length of about 0.4 µm. The gate electrodes 205aa and 205ba have a gate width of about 1.0 µm, whereas the gate electrodes 205ab and 205bb have a gate width of about 0.4 µm. Each of the gate electrodes 205aa and 205ba is electrically connected with the p-type silicon substrate 201 through the contact holes 204b and 204a, respectively.

There are formed an n-type diffusion layer 206aa acting as a third n-type source region, an n-type diffusion layer 206ab acting as both a first n-type drain region and a third n-type drain region, an n-type diffusion layer 206ac acting as a first n-type source region, an n-type diffusion layer 206ab acting as a fourth n-type source region, an n-type diffusion layer 206bb acting as both the first and fourth n-type drain regions and an n-type diffusion layer 206bc acting as a second n-type source region in the device formation regions on the p-type silicon substrate 201 in self-alignment with both the field oxide films 202 and the gate electrodes 205aa, 205ab, 205ba and 205bb. These n-type diffusion layers 206aa, 206ab, 206ac, 206ab, 206bb and 206bc have the impurity concentration ranging from about $10^{20}$ to about $10^{21}$ cm$^{-3}$. Each of overlap margins of the gate electrodes 205aa and 205ba to the contact holes 204b and 204a is approximately 0.2 µm. For instance, the n-type diffusion layer 206ab has a junction depth ranging from about 0.15 to about 0.2 µm just below the gate oxide film 203, whereas ranging from about 0.2 to about 0.3 µm just below the contact hole 204a. As a result, the gate electrodes 205aa and 205ba are electrically connected with the n-type diffusion layers 206bb and 206ab through the contact holes 204b and 204a, respectively.

The gate electrodes 205ab and 205bb acting also as a word line (WL) are electrically connected with each other outside the memory cell. The first transferor n-channel MOS transistor $T_{T1}$ comprises the gate electrode 205ab, the gate insulating film 203, the n-type diffusion layer 206ac, and the n-type diffusion layer 206ab, the second transferor n-channel MOS transistor $T_{T2}$ comprises the gate electrode 205bb, the gate insulating film 203, the n-type diffusion layer 206bc, and the n-type diffusion layer 206bb, the first driver n-channel MOS transistor $T_{D1}$ comprises the gate electrode 205aa, the gate insulating film 203, the n-type diffusion layer 206aa, and the n-type diffusion layer 206ab, and the second driver n-channel MOS transistor $T_{D2}$ comprises the gate electrode 205ba, the gate insulating film 203, the n-type diffusion layer 206ab, and the n-type diffusion layer 206bb.

These four n-channel MOS transistors are covered with an interlayer insulating film 207 which has a flat surface and at least a bottom surface of which is composed of a silicon dioxide film. The interlayer insulating film 207 comprises a two layer structure including a lower layer composed of a silicon dioxide film having a thickness of about 100 nm and an upper layer composed of aa BPSG film having a thickness of about 600 nm. The interlayer insulating film 207 has a thickness of about 700 nm at greatest, about 200 nm at smallest, and about 450 nm on the gate electrodes 205aa and 205ba located just above the contact holes 204b and 204a. The interlayer insulating film 207 is formed with first and second ground contact holes 208a and 208b reaching the n-type diffusion layers 206aa and 206ab, respectively. The n-type diffusion layers 206aa and 206ab are electrically connected through the ground contact holes 208a and 208b with a grounding conductor 209 formed on the interlayer insulating film 207. The grounding conductor 209 is made of a tungsten-silicide film having a thickness of about 100 nm, and is formed with an opening at an area through which node contacts and bit contacts are to pass. The opening has a diameter about 0.2 µm greater than the diameter of these holes.

The interlayer insulating film 207 and the grounding conductor 209 are covered with a second interlayer insulating film 213 which has a flat surface and at least a bottom surface of which is composed of a silicon dioxide film. The second interlayer insulating film 213 comprises a two layer structure including a lower layer composed of a BPSG film having a thickness of about 150 nm and an upper layer composed of a silicon dioxide film having a thickness of about 150 nm. The second interlayer insulating film 213 has a portion located above the grounding conductor 209 and having a thickness of about 200 nm. This portion of the second interlayer insulating film 213 comprises a BPSG film having a thickness of 150 nm and a silicon dioxide film having a thickness of about 50 nm. On the second interlayer insulating film 213 are formed two dual-gate type p-channel TFTs $T_{L1}$ and $T_{L2}$ each acting as a load.

On the second interlayer insulating film 213 are formed fifth and sixth gate electrodes 221a and 221b composed of a polysilicon film including n- or p-type impurities at the concentration ranging from $10^{16}$ to $10^{20}$ cm$^{-3}$ and having a thickness of about 100 nm. The gate electrodes 221a and 221b have a portion extending above the connection of the gate electrodes 205aa and 205ba with the contact holes 204b and 204a through the second interlayer insulative layer 213, respectively. The second interlayer insulating film 213 together with the gate electrodes 221a and 22ab is covered with a first gate insulating film 223. The first gate insulating film 223 is composed of a silicon dioxide film having a thickness of about 15 nm.

On the gate insulating film 213 are formed first and second polysilicon film patterns each of which is composed of a first polysilicon film having a thickness of about 40 nm. A first polysilicon film pattern comprises a p-type diffusion region 246aa acting as a first p-type drain region, a first channel region 231a a, and a p-type diffusion region 246ab acting as a first p-type source region, whereas a second polysilicon film pattern comprises a p-type diffusion region 246ab acting as a second p-type drain region, a second channel region 231ba, and a p-type diffusion region 246bb acting as a second p-type source region.

These p-type diffusion regions 246aa, 246ab, 246ab and 246bb have the impurity concentration ranging from about $10^{18}$ to about $10^{20}$ cm$^{-3}$. The first and second channel regions 231a a and 231ab are each composed of an n-type polysilicon film having the impurity concentration ranging from about $10^{16}$ to about $10^{18}$ cm$^{-3}$, and covers the gate electrodes 221a and 221b through the gate insulating film 223, respectively. The p-type diffusion region 246ab has a portion extending above a portion of the gate electrode 205aa at which the gate electrode 205aa is connected to the contact hole 204b, with the gate insulating film 223 being sandwiched therebetween, and the p-type diffusion region 246aa has a portion extending above a portion of the gate electrode 205ba at which the gate electrode 205ba is connected to the contact hole 204a, with gate insulating film 223 being sandwiched therebetween. The p-type diffusion regions 246ab and 246bb constitute a part of a power source line, and are electrically connected with each other outside the memory cell.

The gate insulating film 223 together with the first and second polysilicon film patterns is covered with a second gate insulating film 233 composed of a silicon dioxide film having a thickness of about 15 nm. On the gate insulating film 233 are formed third and fourth polysilicon film patterns 235a and 235b composed of a second polysilicon film including n- or p-type impurities at the concentration ranging from $10^{16}$ to $10^{20}$ cm$^{-3}$ and having a thickness of about 100 nm. The third polysilicon film pattern 235a covers the channel region 231aa through the gate insulating film 233, and also covers the gate electrode 221a through the gate insulating films 233 and 223. The fourth polysilicon film pattern 235a covers the channel region 231ab through the gate insulating film 233, and also covers the gate electrode 221b through the gate insulating films 233 and 223.

There are formed a first node contact hole 238b passing through the polysilicon film pattern 235a, gate insulating film 233, p-type diffusion region 246ab, gate insulating film 223, gate electrode 221a, second interlayer insulating film 213, first interlayer insulating film 207 and gate oxide film 203 and reaching the gate electrode 205aa, and a second node contact hole 238a passing through the polysilicon film pattern 235b, gate insulating film 233, p-type diffusion region 246aa, gate insulating film 223, gate electrode 221b, second interlayer insulating film 213, first interlayer insulating film 207 and gate insulating film 203 and reaching the gate electrode 205ba. These node contact holes 238a and 238b have a diameter of about 0.4 µm.

A first conductive film pattern or tungsten-silicide film pattern 241a composed of a conductive tungsten-silicide film having a thickness of about 100 nm selectively covers the polysilicon film pattern 235a, and is electrically connected with the gate electrode 205aa through the node contact hole 238b. A seventh gate electrode 245a comprises the tungsten-silicide film pattern 241a and the polysilicon film pattern 235a. A second conductive film pattern or tungsten-silicide film pattern 241b composed of the common conductive tungsten-silicide film selectively covers the polysilicon film pattern 235b, and is electrically connected with the gate electrode 205ba through the node contact hole 238a. An eighth gate electrode 245b comprises the tungsten-silicide film pattern 241b and the polysilicon film pattern 235b. The fifth and sixth gate electrodes 245a and 245b have a gate length of about 0.8 µm and a gate width of about 0.4 µm. Similarly, the fifth and sixth gate electrodes 221a and 221b have a gate length of about 0.8 µm and a gate width of about 0.4 µm.

A first p-channel TFT $T_{L1}$ acting as a load comprises the gate electrode 245a, the gate insulating film 233, the p-type diffusion region 246aa, the channel region 231aa, the p-type diffusion region 246ab, the gate insulating film 223 and the gate electrode 221a. A second p-channel TFT $T_{L1}$ acting as a load comprises the gate electrode 245b, the gate insulating film 233, the p-type diffusion region 246ab, the channel region 231ba, the p-type diffusion region 246bb, the gate insulating film 223 and the gate electrode 221b. The gate electrode 245a and 221a, the p-type diffusion region 246ab and the gate electrode 205aa connected to the n-type diffusion layer 206bb are connected to one another through the tungsten-silicide film pattern 241a and the node contact hole 238b to thereby form a second node $N_2$. Similarly, the gate electrodes 245b and 221b, the p-type diffusion region 246aa and the gate electrode 205ba connected to the n-type diffusion layer 206ab are connected to one another through the tungsten-silicide film pattern 241b and the node contact hole 238a to thereby form a first node $N_1$.

In the second embodiment, the tungsten-silicide film is used as a conductive film. It should be noted that a material of which a conductive film is made is not to be limited to the tungsten-silicide film. Similarly to the first embodiment, the conductive film may be composed of a refractory metal film such as a tungsten or molybdenum film, a refractory metal silicide film such as a molybdenum silicide film and a titanium silicide film, or a titanium nitride film or a titanium tungsten film.

The second interlayer insulating film 213, the first and second p-channel TFTs and the gate insulating film 233 are covered with a third interlayer insulating film 253 which has a flat surface and at least a bottom surface of which is composed of a silicon dioxide film. The third interlayer insulating film 253 comprises a two layer structure including a lower layer composed of a silicon dioxide film having a thickness of about 100 nm and an upper layer composed of a BPSG film having a thickness of about 450 nm. The third interlayer insulating film 253 has a thickness of about 200 nm at a portion thereof covering the first and second p-channel TFTs, which portion is composed of a BPSG film having a thickness of about 100 nm and a silicon dioxide film having a thickness of about 100 nm. There are formed first and second bit contact holes 254a and 254b passing through the third interlayer insulating film 253, the gate insulating films 233 and 223, the second interlayer insulating film 213, the first interlayer insulating film 207 and the gate insulating film 203, and reaching the n-type diffusion layer 206ac and 206bc, respectively. These bit contact holes 254a and 254b have a diameter of about 0.4 µm. On the third interlayer insulating film 253 are formed a pair of bit lines 259a (BL-1) and 259b (BL-2) which are electrically connected with the n-type diffusion layers 206ac and 206bc through the bit contact holes 254a and 254b, respectively.

Although the grounding conductor 209 is disposed on the first interlayer insulating film 207 in the second embodiment, the position and configuration of the grounding conductor 209 is not to be limited to those of the embodiment. For instance, a p-channel TFT acting as a load may be formed on the first interlayer insulating film 207, and the grounding conductor 209 may be formed on either the second interlayer insulative layer 213 or the third interlayer insulative layer 253.

With reference to FIGS. 7A to 7C and FIGS. 8A to 8F which are cross-sectional views taken along the lines X—X of FIGS. 7A and 7B, the above mentioned SRAM memory cell of the second embodiment is manufactured in accordance with 0.4 µm design rule as follows.

On the p-type silicon substrate 201 are formed the field oxide films 202 having a thickness of about 500 nm in device isolation regions by selective oxidation, and the gate oxide films 203 having a thickness of about 10 nm in device formation regions by thermal oxidation. The contact holes 204a and 204b are formed at a certain location in the gate oxide film 203 by wet etching using buffered hydrofluoric acid. The contact holes 204a and 204b have a diameter of about 0.4 μm.

Then, an n-type polysilicon film having a thickness of about 100 nm is deposited over a resultant by LPCVD and ion-implanting, and successively a tungsten-silicide film having a thickness of about 150 nm is deposited thereover by sputtering. The thus deposited films are patterned, for instance, by anisotropic dry etching in which etching gas including $SF_6$, HBr and $Cl_2$ is to be used, to thereby form the polycided gate electrodes 205aa, 205ab, 205ba and 205bb. For instance, an overlap margin between a distal end of the gate electrode 205aa and the gate oxide film 203 within the contact hole 204b is about 0.2 μm. In other words, for instance, the gate electrode 205aa is shaped in 1.0 μm square within the contact hole 204b. The reason why the gate electrodes 205aa and 205ba are enlarged in alignment with the contact holes 204b and 204a is that upper surfaces of the gate electrodes 205aa and 205ba make bottom surfaces of the node contact holes.

Then, there are formed the n-type diffusion layers 206aa, 206ab, 206ac, 206ab, 206bb and 206bc on the p-type silicon substrate 201, for instance, by arsenic (As) ion-implanting using the field oxide films 202 and the gate electrodes 205aa, 205ab, 205ba and 205bb as a mask. The n-type diffusion layers 206aa, 206ab, 206ac, 206ab, 206bb and 206bc have the impurity concentration ranging from about $10^{20}$ to about $10^{21}$ $cm^{-3}$. For instance, the n-type diffusion layer to be formed just below the contact hole 104a has a junction depth ranging from 0.2 to 0.3 μm, whereas the n-type diffusion layer to be formed just below the gate oxide film 203 has a junction depth ranging from 0.2 to 0.3 μm. Thus, these two n-type diffusion layers are electrically connected with each other by horizontal diffusion to thereby form the n-type diffusion layer 206ab.

Figure 8A:
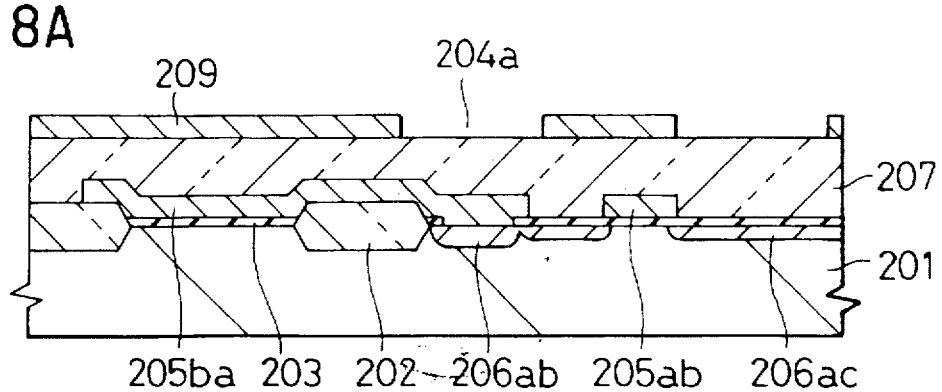
FIGS. 8A to 8F are cross-sectional views taken along the lines Y—Y in FIGS. 7A and 7B, showing respective step of a method of fabricating the semiconductor memory device illustrated in FIGS. 7A to 7C.

Then, over a resultant is formed the first interlayer insulating film 207 which has a flat surface and at least a bottom surface of which is made of a silicon dioxide film by LPCVD and, for instance, chemical and mechanical polishing (CMP). The first interlayer insulating film 207 is formed as follows, for instance. A silicon dioxide film having a thickness of about 100 nm is first deposited over a resultant by LPCVD, and then a BPSG film having a thickness of about 600 nm is deposited over the silicon dioxide film by LPCVD. Then, re-flow treatment is carried out at temperature in the range of 800° C. to 850° C., and subsequently, a surface of a resultant is flattened by CMP. Then, the ground contact holes 208a and 208b reaching the n-type diffusion layers 206aa and 206ab are formed in the first interlayer insulating film 207. Then, a tungsten-silicide film is deposited over a resultant. Then, there is formed an opening in a certain area of the tungsten-silicide film, for instance, by anisotropic dry etching in which etching gas composed of SF6, HBr and C12 is used. Herein, the certain area has about 0.2 μm greater diameter than diameters of the node contact holes and bit contact holes to be formed in subsequent steps. The opening has an inner diameter of about 1.0 μm. Thus, there is formed the grounding conductor 209 electrically connected with the n-type diffusion layers 206aa and 206ab through the ground contact holes 208a and 208b, as illustrated in FIGS. 7A, 7C and 8A.

Then, over a resultant is formed by LPCVD and CMP the second interlayer insulating film 213 which has a flat surface and at least a bottom surface of which is made of a silicon dioxide film. The second interlayer insulating film 213 is formed as follows, for instance. A BPSG film having a thickness of about 150 nm is deposited by LPCVD. Then, re-flow treatment is carried out, and subsequently, a silicon dioxide film having a thickness of about 150 nm is deposited over a resultant by LPCVD. Then, a surface of the silicon dioxide film is flattened by CMP. Then, a polysilicon film having a thickness of about 100 nm is deposited by LPCVD. Then, n- or p-type impurities are ion-implanted into the polysilicon film at the impurity concentration in the range of $10^{16}$ to $10^{19}$ $cm^{-3}$.

The thus formed first polysilicon film is patterned, for instance, by anisotropic dry etching in which etching gas composed of HBr and $Cl_2$ is used, to thereby form the fifth and sixth gate electrodes 221a and 221b. The fifth gate electrode 221a has an end extending through the second and first interlayer insulating films 213 and 207 above a portion of the gate electrode 205aa being in connection with the contact hole 204b. The sixth gate electrode 221b has an end extending through the second and first interlayer insulating films 213 and 207 above a portion of the gate electrode 205ba being in connection with the contact hole 204a. Then, over a resultant is deposited by LPCVD the first gate insulating film 233 having a thickness of about 15 nm and composed of a silicon dioxide film (HTO film).

Then, an amorphous silicon film having a thickness of about 40 nm is deposited by LPCVD. A resultant is thermally annealed at about 600° C. for about 10 hours to thereby cause the amorphous silicon film to change into a polysilicon film. Then, n-type impurities are ion-implanted into the polysilicon film. Thus, there is formed the n-type polysilicon film (first polysilicon film) having the impurity concentration in the range of $10^{16}$ to $10^{18}$ $cm^{-3}$.

Figure 8B:
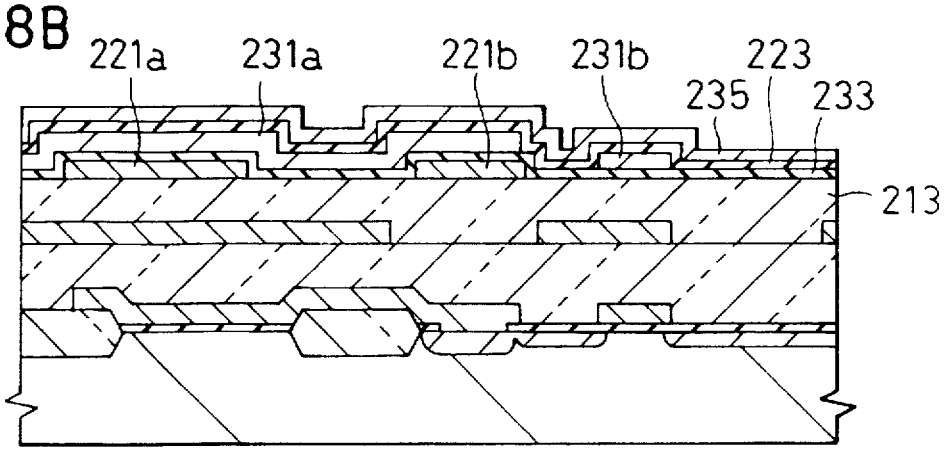
Figure 8C:
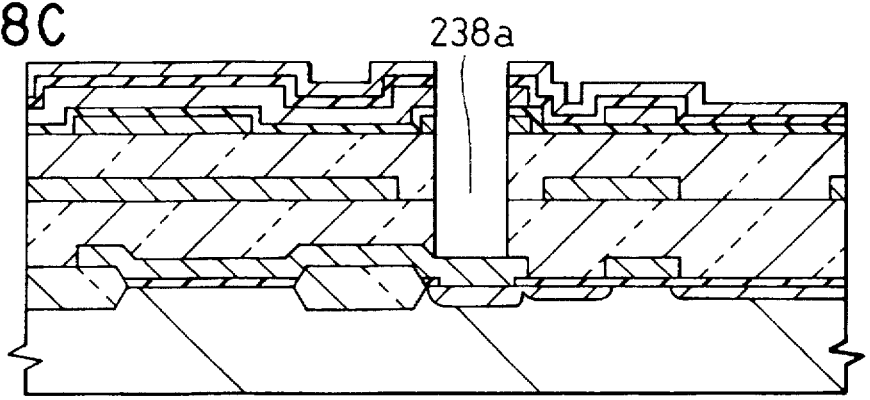

The thus formed first polysilicon film is patterned, for instance, by anisotropic dry etching in which etching gas composed of HBr and $Cl_2$ is used, to thereby form the first and second polysilicon film patterns 231a and 231b. The first polysilicon film pattern 231a has an end extending through the gate insulating film 223 above the earlier mentioned end of the sixth gate electrode 221b. The second polysilicon film pattern 231b has an end extending through the gate insulating film 223 above the earlier mentioned end of the fifth gate electrode 221a. Then, over a resultant is deposited by LPCVD the second gate insulating film 233 having a thickness of about 15 nm and composed of a silicon dioxide film (HTO film). Then, a polysilicon film having a thickness of about 100 nm is deposited over a resultant by LPCVD. N- or p-type impurities at the concentration in the range of $10^{16}$ to $10^{19}$ $cm^{-3}$ are doped by ion-implanting into the polysilicon film to thereby form the second polysilicon film 235, as illustrated in FIG. 8B.

Then, the polysilicon film 235, the gate insulating film 233, the polysilicon film patterns 231a and 231b, the gate insulating film 223, the sixth and fifth gate electrodes 221b and 221a, the second interlayer insulating film 213, and the first interlayer insulating film 207 are successively anisotropically etched using photoresist films (not illustrated) as a mask, to thereby form the first and second node contact holes 238a and 238b. The first node contact hole 238a reaches the gate electrode 205ba generally just above the contact hole 204a, whereas the second node contact hole 238b reaches the gate electrode 205aa generally just above the contact hole 204b, as illustrated in FIGS. 7A to 7C and 8C. These node contact holes 238a and 238b have a diameter of 0.4 µm. A margin of the polysilicon film patterns 231a and 231b to the node contact holes 238a and 238b is about 0.2 µm.

The anisotropic etching for the formation of the node contact holes 238a and 238b is carried out as follows. First, the polysilicon film 235 is anisotropically dry-etched by using etching gas composed of HBr and Cl₂. Then, the gate insulating film 233 is anisotropically dry-etched by using etching gas composed of CHF₃. Then, the polysilicon film patterns 231a and 231b are anisotropically dry-etched by using etching gas composed of HBr and Cl₂. Then, the gate insulating film 223 is anisotropically dry-etched by using CHF₃ as etching gas. Subsequently, the fifth and sixth gate electrodes 221a and 221b are anisotropically dry-etched by using HBr and Cl₂ as etching gas. Then, the second and first interlayer insulating films 213 and 207 are anisotropically dry-etched in succession by using etching gas composed of CHF₃. Since the second and first interlayer insulating films 213 and 207 are flattened at their surfaces, it is possible to have adequate controllability of the anisotropic dry etching. The removal of the above mentioned photoresist is carried out preferably by oxygen plasma enhanced ashing, because the photoresist is exposed to a series of the anisotropic etching for a relatively long period of time. Accordingly, it is necessary to carry out washing with acid and surface treatment with weak hydrofluoric acid subsequently to the ashing. In the embodiment, since the gate insulating film 233 is not in direct contact with the photoresist, the gate insulating film 233 is slightly under-cut on the surface treatment with weak hydrofluoric acid, however, it is possible to avoid the gate insulating film 233 from being made locally thin in thickness.

Figure 8D:
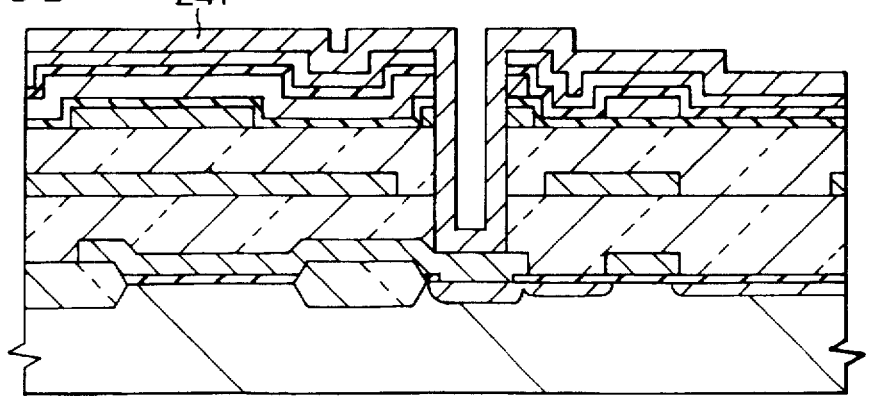
Figure 8E:
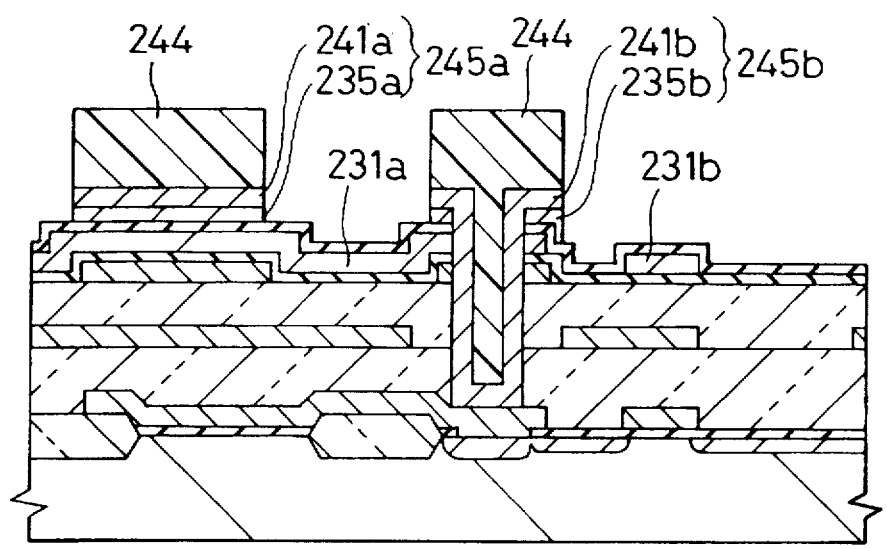
Figure 8F:
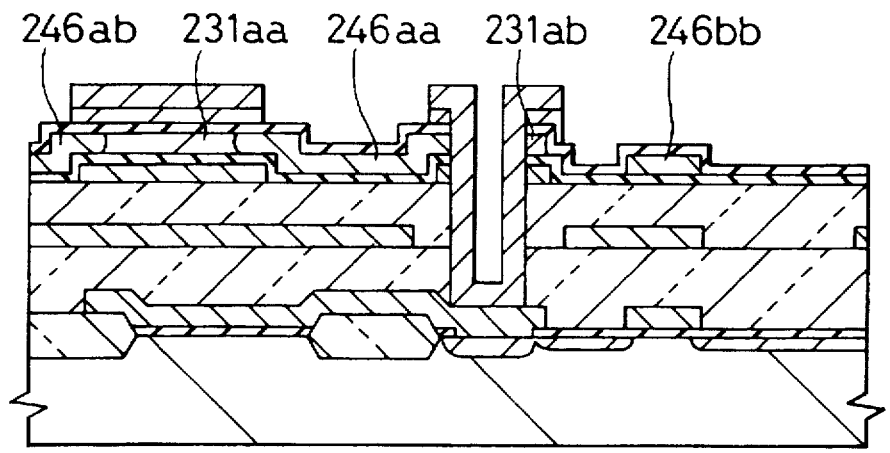

Then, the tungsten-silicide film 241 having a thickness of about 100 nm, which is an electrically conductive film, is deposited over a resultant by LPCVD, as illustrated in FIG. 8D, similarly to the first embodiment. In LPCVD, source gas composed of WF₆ and SiH₂Cl₂ is used, and WF₆ is reduced by SiH₂Cl₂ with the result of formation of the tungsten-silicide film 141. Sputtering, which has poor coverage for irregularities, is not suitable for the formation of the tungsten-silicide film 241, because the node contact holes 238a and 238b have a relatively high aspect ratio of about 2.5, and also because the gate insulating films 233 and 223 and the like are under-cut. It is also unsuitable to fill the node contact holes 238a and 238b with a selectively grown tungsten film. When other materials than a tungsten-silicide film are to be used as an electrically conductive film, it is not preferable to use sputtering, and it is preferable to use LPCVD, MOCVD or MBE for deposition. For instance, a molybdenum silicide film can be deposited by LPCVD in which MoCl₅ is reduced with SiH₄.

Then, the tungsten silicide film 241 and the polysilicon film 235 are successively patterned by anisotropic etching in which the photoresist film 244 is used as a mask, to form both the seventh gate electrode 245a having a polycided structure comprising the third polysilicon film pattern 235a and the tungsten silicide film pattern 241a as the first conductive film pattern deposited thereon, and the eighth gate electrode 245b having a polycided structure comprising the fourth polysilicon film pattern 235b and the tungsten silicide film pattern 241b as the second conductive film pattern deposited thereon. The seventh and eighth gate electrodes 245a and 245b are disposed generally just above the fifth and sixth gate electrodes 221a and 221b through the gate insulating films 233 and 223 and the like, respectively. The tungsten silicide film pattern 241a is electrically connected with the gate electrodes 221a and 205aa through the node contact hole 238b, thereby the seventh and fifth gate electrodes 245a and 221a being electrically connected with the gate electrode 205aa. Similarly, the tungsten silicide film pattern 241b is electrically connected with the gate electrodes 221b and 205ba through the node contact hole 238a, thereby the eighth and sixth gate electrode 245b and 221b being electrically connected with the gate electrode 205ba, as illustrated in FIGS. 7A to 7C and 8E. Each of overlap margins of the gate electrodes 245b and 245a to the node contact holes 238a and 238b is about 0.2 µm. Each of the gate electrodes 245a, 245b, 221a and 221b has a gate length of about 0.8 µm, and a gate width of about 0.4 µm.

Then, boron is ion-implanted into a resultant by using the gate electrodes 245a and 245b as a mask. The boron ion-implanting may be carried out either with the photoresist 244 unremoved or with the photoresist 244 removed. Subsequently to the boron ion-implanting and the removal of the photoresist 244, rapid thermal annealing (RTA) is carried out at 1000° C. for 10 seconds. Thus, in the first polysilicon film pattern 231a are formed the p-type diffusion region 246aa acting as the first p-type drain region, and the p-type diffusion region 246ab constituting a part of the power source line and acting as the first p-type source region. Concurrently, the first channel region 231a a remains unchanged substantially below the gate electrode 145a, and the n-type polysilicon film pattern 231ab remains unchanged partially around the node contact hole 238b. In the second polysilicon film pattern 231b are formed the p-type diffusion region 246ab acting as the second p-type drain region, and the p-type diffusion region 246bb constituting a part of the power source line and acting as the second p-type source region. Concurrently, the second channel region 231ab remains unchanged substantially below the gate electrode 245b, and the n-type polysilicon film pattern 231bb remains unchanged partially around the node contact hole 238a.

The rapid thermal annealing (RTA) causes the p-type diffusion regions 246aa and 246ab to horizontally expand by about 0.2 to 0.25 µm, which is almost the same as the overlap margin (about 0.2 µm) of the gate electrodes 245b and 245a to the node contact holes 238a and 238b. However, since boron having been added into the tungsten silicide film patterns 241b and 241a diffuse out of a sidewall of the node contact holes 238a and 238b, the p-type diffusion regions 246aa and 246ab come to reach the sidewall of the each of the node contact holes 238a and 238b. The p-type diffusion region 246ab is connected with the tungsten silicide film pattern 241a at the sidewall of the node contact hole 238b, thereby the p-type diffusion region 246ab, the gate electrodes 221a and 205aa, and the n-type diffusion layer 206bb being connected with one another. Similarly, the p-type diffusion region 246aa is connected with the tungsten silicide film pattern 241b at the sidewall of the node contact hole 238a, thereby the p-type diffusion region 246aa, the gate electrode 245b, the gate electrodes 221b and 205ba, and the n-type diffusion layer 206ab being connected with one another, as illustrated in FIGS. 7A to 7C and 8F.

Then, over a resultant is formed by LPCVD and CMP the third interlayer insulating film 253 which has a flat surface and at least a bottom surface of which is made of a silicon dioxide film. The third interlayer insulating film 253 is formed as follows, for instance. A silicon dioxide film having a thickness of about 100 nm is deposited by LPCVD. Then, a BPSG film having a thickness of about 450 nm is deposited over a resultant by LPCVD. Then, a surface of the BPSG film is flattened by CMP subsequently to re-flow treatment. The third interlayer insulating film 253, the gate insulating films 233 and 223, the second interlayer insulating film 213, the first interlayer insulating film 207 and the gate oxide film 203 are successively anisotropically dry-etched to thereby form the first bit contact hole 254a reaching the n-type diffusion layer 206ac and the second bit contact hole 254b reaching the n-type diffusion layer 206bc. Only insulating films composed of silicon dioxide family are etched by the anisotropic dry etching. The bit contact holes 254a and 254b have a diameter of about 0.4 μm, and an aspect ratio of about 3.9.

Then, a plug tungsten film (not illustrated) is selectively grown in the bit contact holes 254a and 254b by high-vacuum LPCVD in which $WF_6$ is reduced with $SiH_4$. Then, over a resultant are successively deposited a titanium film, a titanium nitride film and an aluminum film. These aluminum film, titanium nitride film and titanium film are successively patterned to thereby form a pair of the bit lines 259a and 259b. The bit line 259a is electrically connected with the n-type diffusion layer 106ac through the contact hole 254a, whereas the bit line 259b is electrically connected with the n-type diffusion layer 206bc through the contact hole 254b, as illustrated in FIGS. 7A to 7C.

A load element manufactured in accordance with the above mentioned second embodiment is a dual-gate type p-channel TFT having a gate electrode comprising a polysilicon film and a tungsten silicide film deposited on the polysilicon film. Thus, it is possible to cause the tungsten silicide film to constitute a part of the cross connection of a pair of CMOS inverters, similarly to the first embodiment. Thus, the second embodiment can have the same advantages as those of the first embodiment. In addition, the second embodiment further provides superior current driving ability relative to the first embodiment, because the second embodiment includes the dual-gate type p-channel TFT as a load element.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor memory device comprising:

(a) a first MOS transistor acting as a transferor and formed on a first-conductivity-type silicon substrate, said first transferor MOS transistor including a first source region electrically connected to one of a pair of bit lines, a first drain region, a gate insulating film, and a first gate electrode electrically connected to a word line, said first transferor MOS transistor having a second-conductivity-type channel;

(b) a second MOS transistor acting as a transferor and formed on said first-conductivity-type silicon substrate, said second transferor MOS transistor including a second source region electrically connected to said other of said pair of bit lines, a second drain region, a gate insulating film, and a second gate electrode electrically connected to said word line, said second transferor MOS transistor having a second-conductivity-type channel;

(c) a first MOS transistor acting as a driver and formed on said first-conductivity-type silicon substrate, said first driver MOS transistor including a third source region electrically connected to a grounding conductor, a third drain region electrically connected to said first drain region, a gate insulating film, and a third gate electrode, said first driver MOS transistor having a second-conductivity-type channel;

(d) a second MOS transistor acting as a driver and formed on said first-conductivity-type silicon substrate, said second driver MOS transistor including a fourth source region electrically connected to said grounding conductor, a fourth drain region electrically connected to both said second drain region and said third gate electrode, a gate insulating film, and a fourth gate electrode electrically connected to said third drain region, said second driver MOS transistor having a second-conductivity-type channel;

(e) an interlayer insulating film covering surfaces of said first and second transferor MOS transistors and said first and second driver MOS transistors therewith;

(f) a first polysilicon film pattern composed of a first polysilicon film deposited on said interlayer insulating film, said first polysilicon film pattern comprising a first first-conductivity-type drain region having a portion A extending above said fourth gate electrode, a first channel region, and a first first-conductivity-type source region electrically connected to a power source line;

(g) a second polysilicon film pattern composed of said first polysilicon film, said second polysilicon film pattern comprising a second first-conductivity-type drain region having a portion B extending above said third gate electrode, a second channel region, and a second first-conductivity-type source region electrically connected to said power source line;

(h) a gate insulating film deposited over said interlayer insulating film for covering surfaces of said first and second polysilicon film patterns;

(i) a third film pattern comprising an upper conductive film layer and a lower layer composed of a second polysilicon film deposited an said gate insulating film, said third film pattern having a portion extending above said portion B, said third film pattern covering said first channel region with said gate insulating film sandwiched therebetween;

(j) a fourth film pattern comprising an upper conductive film layer and a lower layer composed of said second polysilicon film, said fourth film pattern having a portion extending above said portion A, said fourth film pattern covering said second channel region with said gate insulating film sandwiched therebetween;

(k) a first sidewall defining a first node contact hole reaching said third gate electrode through said third polysilicon film pattern, gate insulating film, second first-conductivity-type drain region and interlayer insulating film;

(l) a second sidewall defining a second node contact hole reaching said fourth gate electrode through said fourth film pattern, gate insulating film, first first-conductivity-type drain region and interlayer insulating film, said upper conductive film layer of said fourth film pattern covering said second sidewall, the upper conductive film layer directly contacting said fourth gate electrode;

(m) a fifth gate electrode selectively and directly covering an upper surface of said third polysilicon film pattern, said fifth gate electrode comprising a first conductive film pattern electrically connected with said third gate electrode and said second first-conductivity-type drain region through said first node contact hole;

(n) a sixth gate electrode selectively and directly covering an upper surface of said fourth polysilicon film pattern, said sixth gate electrode comprising a second conductive film pattern electrically connected with said fourth gate electrode and said first first-conductivity-type drain region through said second node contact hole;

(o) a first thin film transistor acting as a load and having a first-conductivity-type channel, said first thin film transistor comprising said first first-conductivity-type source region, first channel region, first first-conductivity-type drain region, gate insulating film and fifth gate electrode; and (p) a second thin film transistor acting as a load and having a first-conductivity-type channel, said second thin film transistor comprising said second first-conductivity-type source region, second channel region, second first-conductivity-type drain region, gate insulating film and sixth gate electrode.

2. The semiconductor memory device as set forth in claim 1, wherein said first conductivity type is p-type and said second conductivity type is n-type.

3. The semiconductor memory device as set forth in claim 1, wherein said first and second conductive film patterns include one of refractory metal and refractory metal silicide.

4. The semiconductor memory device as set forth in claim 1, wherein said first and second conductive film patterns include one of titanium nitride and titanium-tungsten.

5. The semiconductor memory device as set forth in claim 1, wherein said upper conductive film layers have a smaller resistance than said lower layers, to establish an RC delay circuit between nodes of a resulting SRAM cell.

6. A semiconductor memory device comprising:

(a) a first MOS transistor acting as a transferor and formed on a first-conductivity-type silicon substrate, said first transferor MOS transistor including a first source region electrically connected to one of a pair of bit lines, a first drain region, a gate insulating film, and a first gate electrode electrically connected to a word line, said first transferor MOS transistor having a second-conductivity-type channel;

(b) a second MOS transistor acting as a transferor formed on said first-conductivity-type silicon substrate, said second transferor MOS transistor including a second source region electrically connected to said other of said pair of bit lines, a second drain region, a gate insulating film, and a second gate electrode electrically connected to said word line, said second transferor MOS transistor having a second-conductivity-type channel;

(c) a first MOS transistor acting as a driver and formed on said first-conductivity-type silicon substrate, said first driver MOS transistor including a third source region electrically connected to a grounding conductor, a third drain region electrically connected to said first drain region, a gate insulating film, and a third gate electrode, said first driver MOS transistor having a second-conductivity-type channel;

(d) a second MOS transistor acting as a driver formed on said first-conductivity-type silicon substrate, said second driver MOS transistor including a fourth source region electrically connected to said grounding conductor, a fourth drain region electrically connected to both said second drain region and said third gate electrode, a gate insulating film, and a fourth gate electrode electrically connected with said third drain region, said second driver MOS transistor having a second-conductivity-type channel;

36

(e) an interlayer insulating film covering surfaces of said first and second transferor MOS transistors and said first and second driver MOS transistors therewith;

(f) a fifth gate electrode formed on said interlayer insulating film, said fifth gate electrode having a portion A extending above said third gate electrode;

(g) a sixth gate electrode formed on said interlayer insulating film, said sixth gate electrode having a portion B extending above said fourth gate electrode;

(h) a first gate insulating film deposited over said interlayer insulating film for covering surfaces of said fifth and sixth gate electrodes;

(i) a first polysilicon film pattern composed of a first polysilicon film deposited on said first gate insulating film, said first polysilicon film pattern comprising a first first-conductivity-type drain region having a portion C extending above said sixth gate electrode, a first channel region located above said fifth gate electrode, and a first first-conductivity-type source region electrically connected to a power source line;

(j) a second polysilicon film pattern composed of said first polysilicon film, said second polysilicon film pattern comprising a second first-conductivity-type drain region having a portion D extending above said fifth gate electrode, a second channel region located above said sixth gate electrode, and a second first-conductivity-type source region electrically connected to said power source line;

(k) a second gate insulating film deposited over said first gate insulating film for covering surfaces of said first and second polysilicon film patterns;

(l) a third film pattern comprising an upper conductive film layer and a lower layer composed of a second polysilicon film deposited on said second gate insulating film and located above said fifth gate electrode;

(m) a fourth film pattern comprising an upper conductive film layer and a lower layer composed of said second polysilicon film and located above said sixth gate electrode;

(n) a first sidewall defining a first node contact hole reaching said third gate electrode through said third polysilicon film pattern, second gate insulating film, second first-conductivity-type drain region, first gate insulating film, fifth gate electrode and interlayer insulating film;

(o) a second sidewall defining a second node contact hole reaching said fourth gate electrode through said fourth film pattern, second gate insulating film, first first-conductivity-type drain region, first gate insulating film, sixth gate electrode and interlayer insulating film said upper conductive film layer of said fourth film pattern covering said second sidewall, the upper conductive film layer directly contacting said fourth gate electrode;

(p) a seventh gate electrode selectively and directly covering an upper surface of said third polysilicon film pattern, said seventh gate electrode comprising a first conductive film pattern electrically connected with said third gate electrode and said second first-conductivity-type drain region through said first node contact hole, and said third polysilicon film pattern;

(q) an eighth gate electrode selectively and directly covering an upper surface of said fourth polysilicon film pattern, said eighth gate electrode comprising a second conductive film pattern electrically connected with said fourth gate electrode and said first first-conductivity-type drain region through said second node contact hole, and said fourth polysilicon film pattern;

(r) a first thin film transistor acting as a load and having a first-conductivity-type channel, said first thin film transistor comprising said fifth gate electrode, first gate insulating film, first first-conductivity-type source region, first channel region, first first-conductivity-type drain region, second gate insulating film and seventh gate electrode; and (s) a second thin film transistor acting as a load and having a first-conductivity-type channel, said second thin film transistor comprising said sixth gate electrode, first gate insulating film, second first-conductivity-type source region, second channel region, second first-conductivity-type drain region, second gate insulating film and eighth gate electrode.

7. The semiconductor memory device as set forth in claim 6, wherein said first conductivity type is p-type and said second conductivity type is n-type.

8. The semiconductor memory device as set forth in claim 6, wherein said first and second conductive film patterns include one of refractory metal and refractory metal silicide.

9. The semiconductor memory device as set forth in claim 6, wherein said first and second conductive film patterns include one of titanium nitride and titanium-tungsten.

10. The semiconductor memory device as set forth in claim 6, wherein said upper conductive film layers have a smaller resistance than said lower layers, to establish an RC delay circuit between nodes of a resulting SRAM cell.

11. A semiconductor memory device, comprising:

(a) a substrate;

(b) a first MOS transistor formed on said substrate and acting as a driver, said first MOS transistor having a first gate electrode; and (c) a second MOS transistor formed on an insulative layer overlying said substrate and acting as a load, said second MOS transistor having a second gate electrode, source/drain regions, a channel region and a gate insulating film sandwiched between the channel region, and the second gate electrode, said second gate electrode including a lower semiconductor layer and an upper layer comprising a metallic compound of said lower semiconductor layer, the upper metallic compound layer covering an inner sidewall of a contact hole and passing through the gate insulating film and reaching the first gate electrode, the upper metallic compound layer directly contacting said first gate electrode.

12. The semiconductor memory device as set forth in claim 11, wherein said semiconductor layer comprises a polysilicon layer, and said layer composed of metallic compound thereof comprises a silicided polysilicon layer.

13. The semiconductor memory device as set forth in claim 11, wherein said metallic compound layer has a smaller resistance than said semiconductor layer to establish an RC delay circuit between nodes of a resulting SRAM cell.

14. A semiconductor memory device, comprising:

(a) a substrate;

(b) a first MOS transistor formed on said substrate and acting as a driver, said first MOS transistor having a first gate electrode; and (c) a second MOS transistor formed on an insulative layer overlying said substrate and acting as a load, said second MOS transistor having source/drain regions, an upper second gate electrode, a channel region, an upper gate insulating film sandwiched between the upper second gate electrode and the channel region, a lower second gate electrode, and a lower gate insulating film sandwiched between the lower second gate electrode and the channel region;

the upper second gate electrode including a lower semiconductor layer and an upper layer comprising a metallic compound of said lower semiconductor layer, the upper metallic compound layer covering an inner sidewall of a contact hole and passing through the gate insulating films and reaching the first gate electrode, the upper metallic compound layer directly contacting said first gate electrode, the lower second gate electrode including a semiconductor layer.

15. The semiconductor memory device as set forth in claim 14, wherein said semiconductor layer of each of said upper and lower second gate electrodes comprises a polysilicon layer, and said layer composed of metallic compound thereof comprises a silicided polysilicon layer.

16. The semiconductor memory device as set forth in claim 14, wherein said metallic compound layer has a smaller resistance than said semiconductor layer to establish an RC delay circuit between nodes of a resulting SRAM cell.

* * * * *